(12) United States Patent
Horie et al.

(10) Patent No.: US 6,195,504 B1
(45) Date of Patent: Feb. 27, 2001

(54) LIQUID FEED VAPORIZATION SYSTEM AND GAS INJECTION DEVICE

(75) Inventors: Kuniaki Horie, Yamato; Hidenao Suzuki, Fujisawa; Tsutomu Nakada; Fumio Kuriyama, both of Yokohama; Takeshi Murakami, Tokyo; Masahito Abe, Fujisawa; Yuji Araki, Fujisawa; Hiroyuki Ueyama, Fujisawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 08/974,512

(22) Filed: Nov. 19, 1997

(30) Foreign Application Priority Data

Nov. 20, 1996 (JP) .................................................. 8-324637
Apr. 4, 1997 (JP) .................................................. 9-102810
Jun. 25, 1997 (JP) .................................................. 9-184485
Oct. 6, 1997 (JP) .................................................. 9-289133

(51) Int. Cl.[7] .............................. A61H 33/06; F24H 1/10
(52) U.S. Cl. .............................................. 392/394; 392/485
(58) Field of Search ................................ 392/386, 394, 392/396, 397, 398, 400, 401, 402, 403, 485, 486, 487, 488, 489; 122/460, 461, 465; 261/139, 142, DIG. 65

(56) References Cited

U.S. PATENT DOCUMENTS

| | | | | |
|---|---|---|---|---|
| 1,738,164 | * | 12/1929 | Zingg | 219/544 |
| 3,563,224 | * | 2/1971 | Bryer | 126/59.5 |
| 4,276,243 | * | 6/1981 | Partus | 261/128 |
| 4,297,563 | * | 10/1981 | Berry | 392/398 |
| 4,465,922 | * | 8/1984 | Kolibas | 392/484 |
| 4,625,678 | | 12/1986 | Shioya et al. | |
| 5,549,078 | * | 8/1996 | Annecharico et al. | 122/13.2 |
| 5,832,177 | * | 11/1998 | Shinagawa et al. | 392/394 |

FOREIGN PATENT DOCUMENTS

| | | |
|---|---|---|
| 41 07 756 | 9/1991 | (DE) . |
| 0 303 911 | 2/1989 | (EP) . |
| 0 635 460 | 1/1995 | (EP) . |
| 2 692 597 | 12/1993 | (FR) . |
| 7-268634 | 10/1995 | (JP) . |

OTHER PUBLICATIONS

Patent Abstracts of Japan, vol. 014, No. 390 (C–0751), Aug. 23, 1990 & JP 02 145768 A (Koujiyundo Kagaku Kenkyusho:KK), Jun. 5, 1990, * abstract *.

* cited by examiner

*Primary Examiner*—Sang Paik
(74) *Attorney, Agent, or Firm*—Wenderoth, Lind & Ponack, L.L.P.

(57) ABSTRACT

A compact vaporizer system is presented to produce a high quality vapor feed from a liquid feed to be delivered to a chemical vapor deposition processing chamber to produce thin film devices based on highly dielectric or ferroelectric materials such as $BaTiO_3$, $SrTiO_3$ and others such materials. The vaporization apparatus comprises a feed tank for storing the liquid feed; feed delivery means for transporting the liquid feed by way of a feed delivery path; a vaporizer section disposed in the delivery path comprising a high temperature heat exchanger having a capillary tube for transporting the liquid feed and a heat source for externally heating the capillary tube; and a vaporization prevention section disposed upstream of the vaporizer section for preventing heating effects of the vaporizer section to the liquid feed within the vaporization prevention section.

13 Claims, 33 Drawing Sheets

F I G. 4
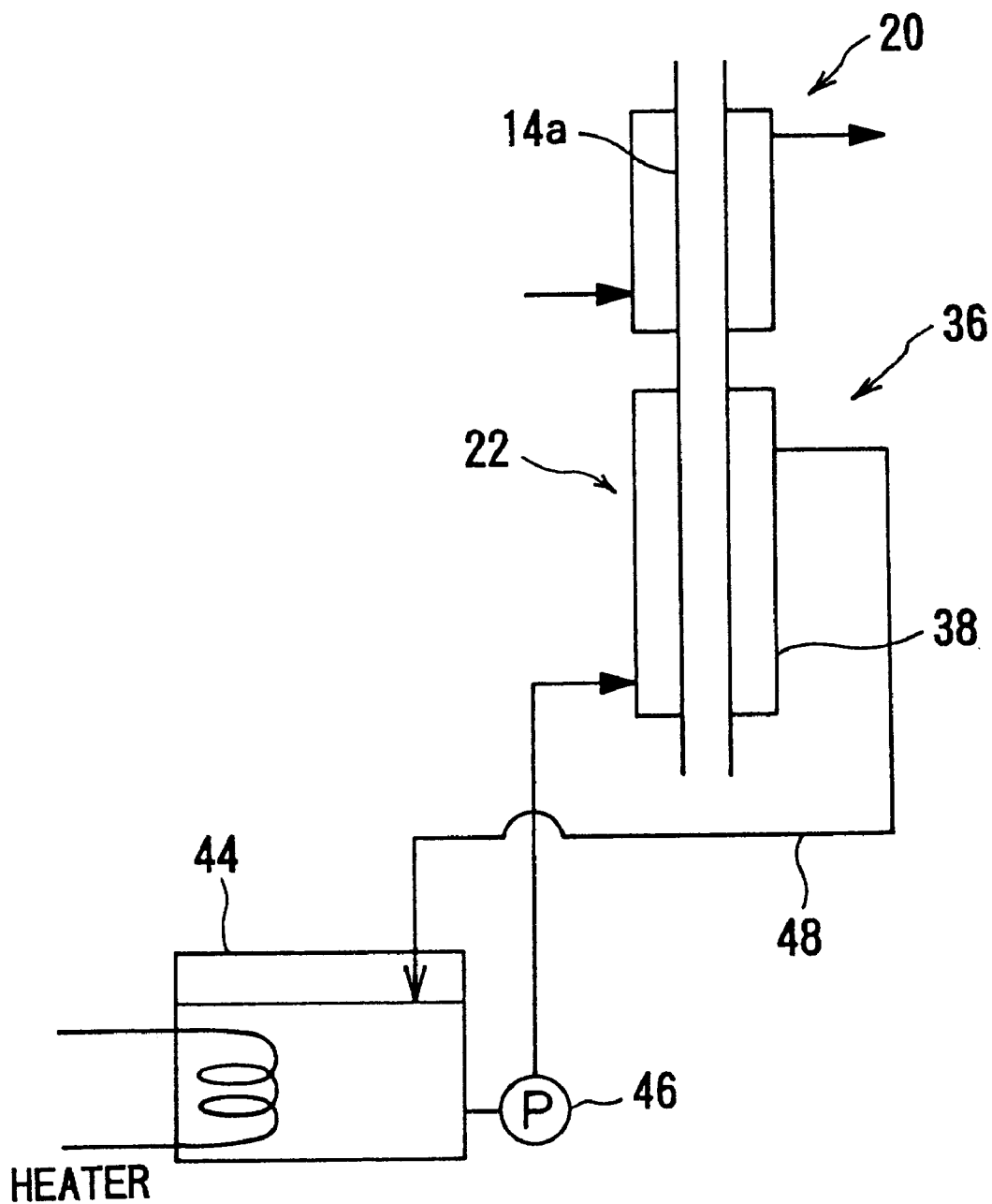

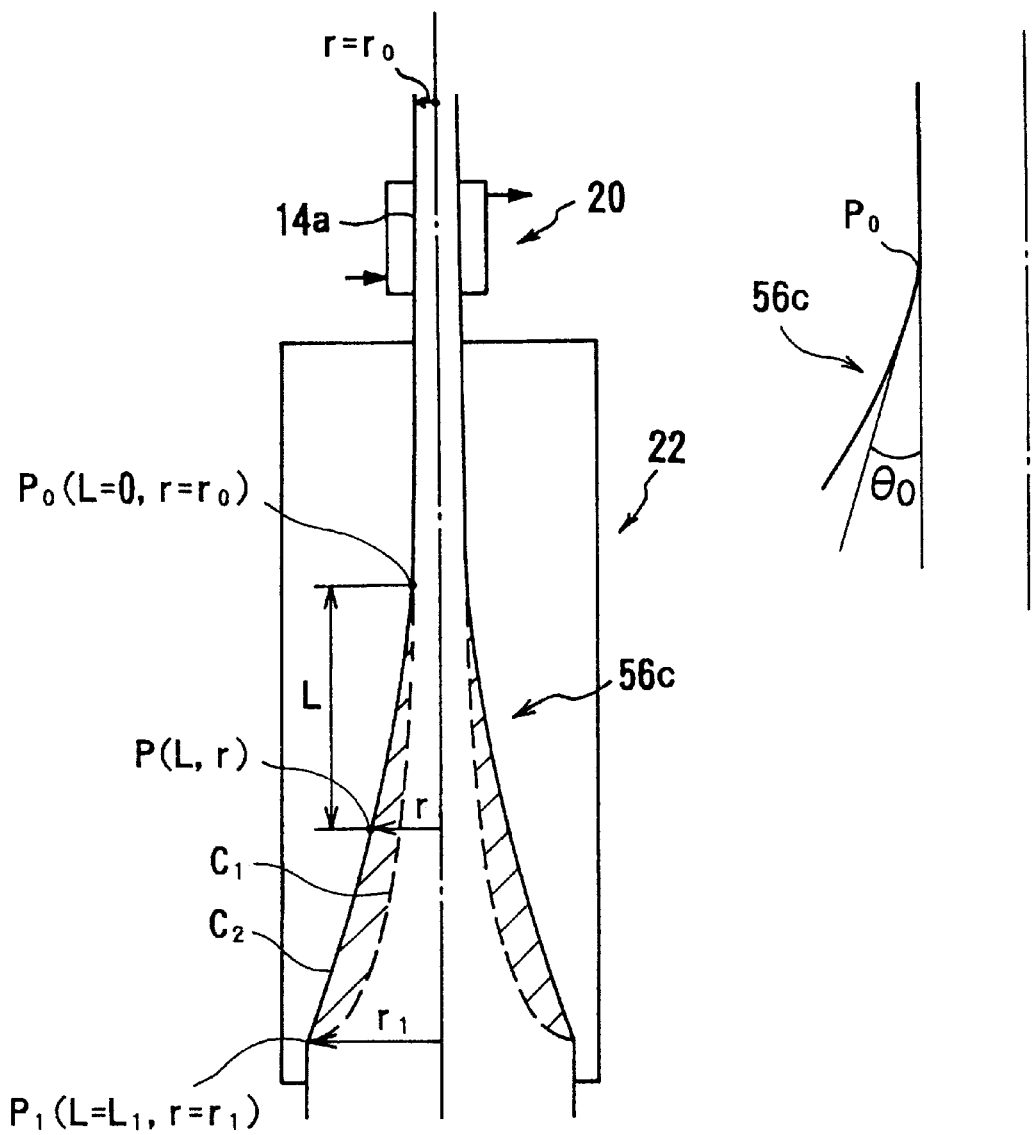

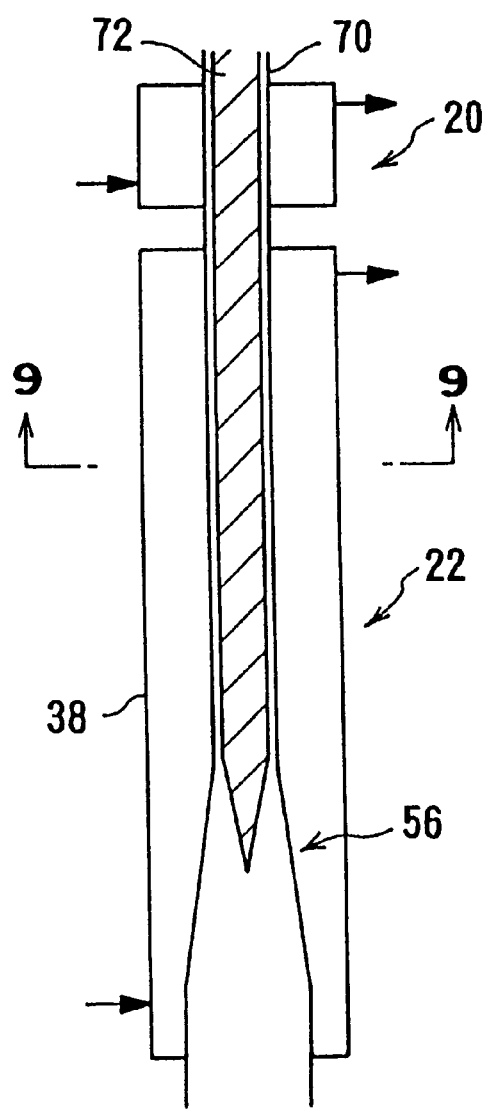
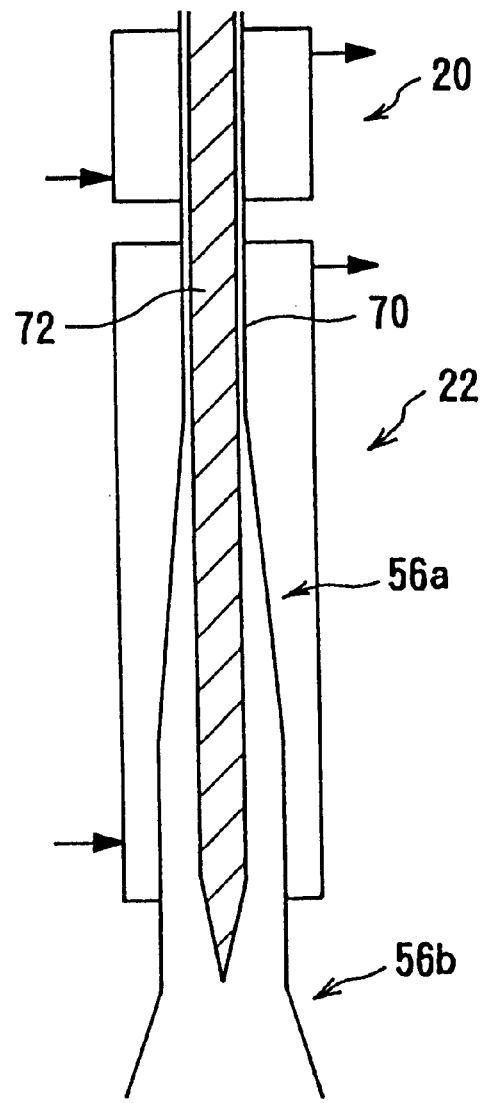
FIG. 8A
FIG. 8B

F I G. 26
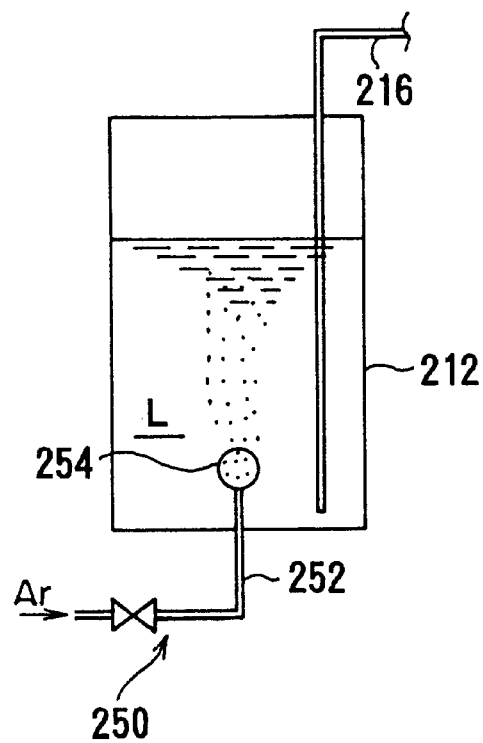
F I G. 27
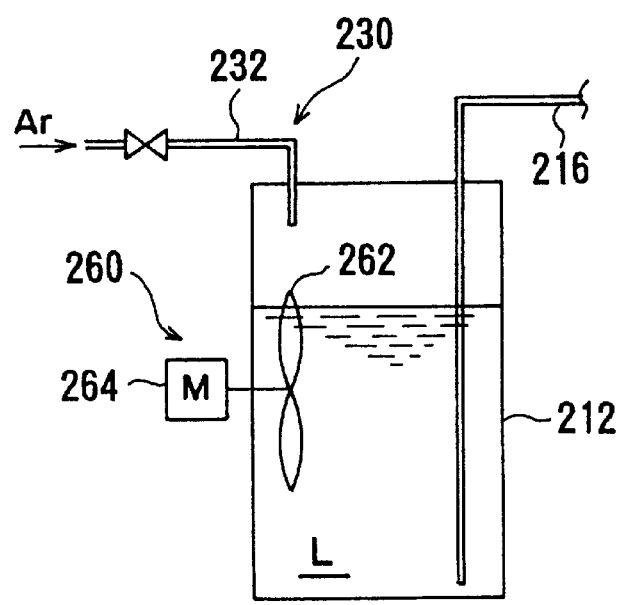

F I G. 28
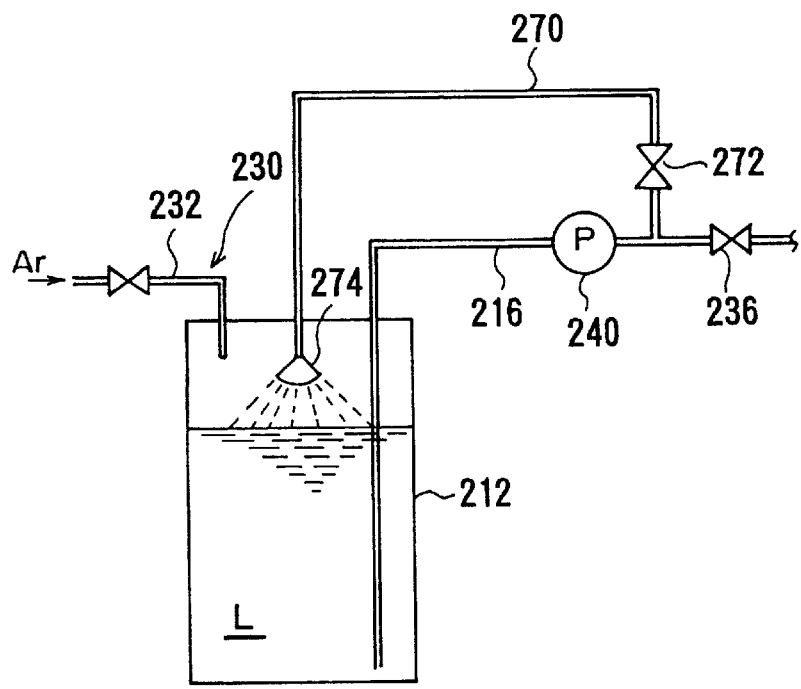
F I G. 29
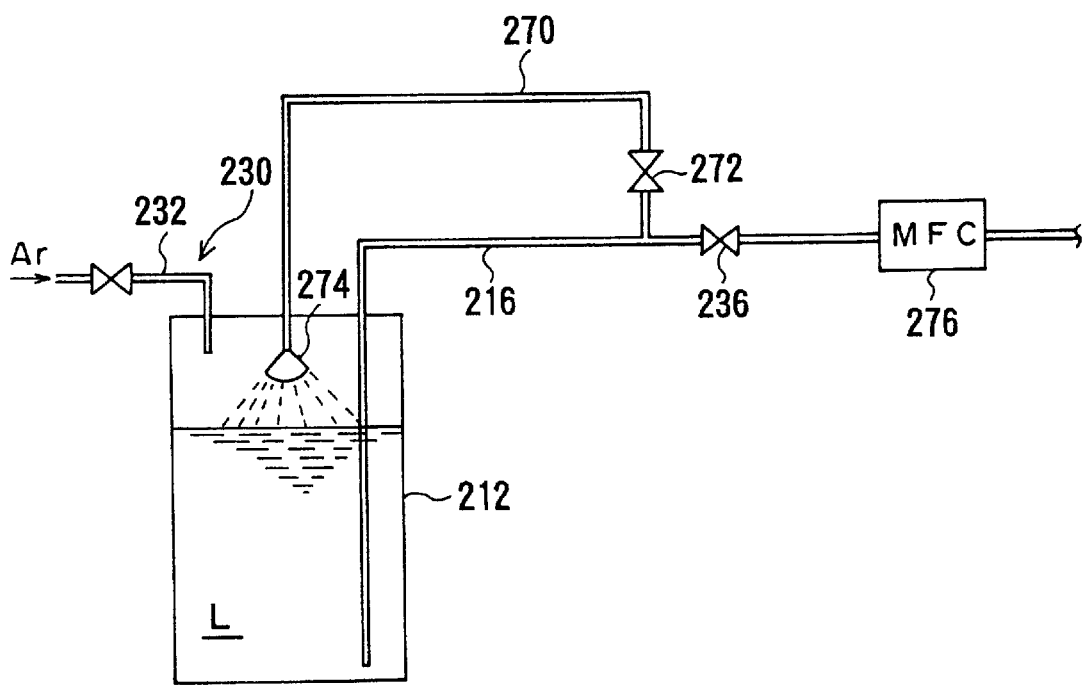

LIQUID FEED VAPORIZATION SYSTEM AND GAS INJECTION DEVICE

BACKGROUND OF THE INVENTION

1. Field of the Invention

The present invention relates in general to vaporizers to convert a liquid feed to a vapor feed for chemical vapor deposition apparatus, and relates in particular to a vaporizer section suitable for a vapor feed material for depositing a highly dielectric or ferroelectric thin film, such as barium or strontium titanate.

2. Description of the Related Art

In recent years, there has been a quantum jump in circuit density of integrated circuit devices produced by the semiconductor industries, and intense development activities are underway in anticipation of giga-bit order DRAMs replacing the prevailing mega-bit order DRAMs of today. Dielectric thin film materials used to make high capacitance devices necessary for producing DRAMs have, in the past, included silicon oxide or silicon nitride films of dielectric constant less than 10, and tantalum pentaoxide ($Ta_2O_5$) films of dielectric constant less than 20; However, newer materials such as barium titanate ($BaTiO_3$), strontium titanate ($SrTiO_3$) or barium-strontium titanate (BST), having dielectric contestants of about 300, appear to be more promising. Promising also are even higher dielectric materials such as lead-zinc-titanate (PZT), lead-lithium-zinc-titanate (PLZT) and Y1.

Of the various methods of making such thin films, prospects are particularly bright for the chemical vapor deposition (CVD) process, and in this case, it is necessary that a gaseous feed must ultimately be supplied in a steady gas stream to a substrate disposed in the deposition chamber. The gaseous feed is produced by heating a liquid mixture of liquefied materials such as $Ba(DPM)_2$ or $Sr(DPM)_2$ (which is solid at normal temperature) and some organic solvent such as THF (Tetrahydrofuran) for stabilization of the vaporization characteristics. Some known examples of vaporizer sections include, for example, those that atomize the liquid feed through spray nozzles or ultrasonic transducers, and deliver the atomized mist to a high temperature zone to convert the mist to a gaseous feed.

However, it is extremely difficult to produce thermodynamically stable vapors of such highly dielectric and ferroelectric materials mentioned above. This is because, for these materials, ① the vaporization and decomposition temperatures are close; ② the vaporization temperature for the liquid feed material is different from that for the organic solvent; ③ the vapor pressures are very low; and ④ the materials are vulnerable to react with a small amount of oxygen, vapor water, etc.

For example, in a liquid feed obtained by dissolving $Ba(DPM)_2$ or $Sr(DPM)_2$ in THF, the solvent exists as a liquid in region (a) in FIG. 34, and the feed material exists as a liquid or solid in region (a+c). In region (b), the feed is totally a vapor. Therefore, when the liquid feed in region (a) is heated to be converted into a vapor feed and passes through the region (c), only the solvent vaporizes, leaving the solute components in the liquid feed to precipitate out. This results in blocking of the gas passages or quality degradation due to changes in composition. For this reason, it is considered important to heat the liquid feed to its high temperature vaporization region as rapidly as possible.

Furthermore, depending on the film material or film deposition conditions, it is sometimes necessary to supply the feed vapor at a minute rate to the deposition chamber. If the process of vaporization is not conducted smoothly and the gaseous feed delivery to the deposition chamber becomes unstable, deposition process will be seriously affected. Therefore, it is important to be able to control the vaporization of the gaseous feed down to very low flow rates.

In the conventional technologies for atomizing the feed liquid based on spray nozzles, it is difficult to control atomization at low flow rates of liquid feed, because of the high pressures used to atomize the liquid. In the ultrasonic atomization techniques, it is difficult to find transducer materials which can withstand the high temperatures used for vaporization. Additionally, it is desirable to carry out the liquid-to-vapor conversion process physically near the deposition chamber so as to minimize the distance of transport. However, the above-mentioned apparatus is usually designed to atomize first and then to vaporize so that it is difficult to make the apparatus small. Also, both techniques require fairly large facilities for atomization and spray purposes, and it is unavoidable that stagnant regions of liquid feed are created within the apparatus, and degradation of the liquid feed and difficulty in controlling the flow rates of gaseous feed are experienced in the current technologies.

SUMMARY OF THE INVENTION

It is an object of the present invention to provide a compact vaporizer section to be used in a chemical vapor deposition apparatus for depositing highly dielectric or ferroelectric materials. Because the thermodynamic behavior of such materials is complex, the vaporizer is designed to preserve delicate properties of the feed material during the process of converting a liquid feed to a vapor feed. The invention also provides a chemical vapor deposition apparatus that prevents blockages caused by premature precipitation of solute materials and allows effective cleaning of the apparatus.

The object has been achieved in a vaporization apparatus for converting a liquid feed to a vapor feed comprising: a feed tank for storing the liquid feed; feed delivery means for transporting the liquid feed by way of a feed delivery path; a vaporizer section disposed in the delivery path comprising a high temperature heat exchanger having a capillary tube for transporting the liquid feed and a heat source for externally heating the capillary tube; and a vaporization prevention section disposed upstream of the vaporizer section for preventing heating effects of the vaporizer section to the liquid feed within the vaporization prevention section.

According to the apparatus presented, a high surface-to-volume ratio of the capillary tube enables the apparatus to carry out the necessary heat transfer to vaporize the liquid feed instantly and uniformly so that the liquid feed is not exposed to conditions which would be conducive to decomposition or degradation. The basic objective of a steady delivery of a minute amount of gaseous feed can be achieved by varying the diameter and the length of the tube to adjust the conductance of the delivery path so that the dwell time of the liquid feed in the vaporizer section is appropriate. Further, by providing the vaporization prevention section, premature degradation or partial loss of the solvent material in the liquid feed, caused by the heating effects of the vaporizer section, can be prevented so that a gaseous feed of a constant and uniform composition can be delivered to the substrate. Additional merits are that the construction of the vaporizer section is simple and the manufacturing cost is low, the device itself is less affected by plugging, maintenance and repair can be carried out easily, and the vaporization prevention section is easily attached to the apparatus.

The high temperature heat exchanger may have a double-wall structure comprised of an inner capillary tube and an outer jacket. The outer tube (jacket) is provided with a thermal medium passage for maintaining a surface temperature of the inner capillary tube constant by circulating a thermal medium supplied from a thermal medium tank maintained at a constant temperature. Steady supply of high quality feed vapor is thus assured.

The capillary tube in the high temperature heat exchanger is a variable output electrical heater whose output power may be controlled by sensor signals, thereby providing sensitive temperature control to enable efficient vaporization.

The capillary tube in the high temperature heat exchanger may have an inner diameter of not more than 3 mm. Such a size is most effective in providing rapid heating of the liquid feed, thereby providing a high quality vapor feed most efficiently.

The capillary tube in the high temperature heat exchanger may be formed into a coil. Such a configuration is effective in providing a compact path when a long dwell time is required.

The vaporization prevention section or the feed delivery path just before the device may be provided with a one-way valve or a shutoff valve or a flow controller. In such an apparatus, when the feed supply is stopped, liquid feed is prevented from unintentionally vaporizing due to the effects of pressure reduction occurring in the apparatus, so that the formation of precipitated particles in the narrow pathway of the device (plugging) can be prevented.

The vaporization prevention section may include a low temperature heat exchanger comprising a constant temperature tank to supply a cooling medium to maintain the liquid feed at an appropriate temperature. In such an apparatus, heating effects from the vaporizer section are blocked so as to produce steady and smooth operation. The vaporization prevention section may comprise a Peltier device, so as to produce a compact and highly efficient cooling unit. The vaporization prevention section or a portion thereof may include an insulating coupling pipe in the feed delivery path in the upstream region of the vaporizer section. In such an apparatus, insulation will prevent the heating effects from reaching to the vaporizer section.

The exit opening of the vaporizer section, or a vicinity of the device, may be communicate with a carrier gas delivery path for flowing a carrier gas at an elevated temperature. This will prevent a temperature drop in the gaseous feed so that a steady supply of high quality gaseous feed can be maintained by preventing undesirable formation of precipitate particles, and by adjusting the composition of the gaseous feed at this stage, processing in later stages can be made more stable.

The diameter of the capillary tube in the high temperature heat exchanger may be enlarged near the feed exit opening, and the cross sectional area of the expander section may be increased toward a downstream direction of the apparatus. In such an apparatus, temperature changes due to pressure variations of the gaseous feed and turbulent flow patterns can be prevented, and the vaporized feed is delivered smoothly to the next stage.

The apparatus may further comprise a cleaning device for cleaning the vaporization prevention section and the vaporizer section by spraying a cleaning agent, and a purging device for purging a residual feed material and impurity substances remaining in the apparatus, including interior spaces of the vaporization prevention section and the vaporizer section, by flowing an inert gas stream therethrough.

The present apparatus may be operated by a method comprising the steps of: transporting the liquid feed through the vaporization prevention section and the vaporizer section; converting the liquid feed to a vapor feed; and supplying the vapor feed to a processing chamber; cleaning interior spaces of the vaporization prevention section and the vaporizer section; and purging the apparatus including interior spaces of the vaporization prevention section and the vaporizer section by flowing an inert gas stream therethrough. In the cleaning step, the temperature of the vaporizer section can be altered from that of the vaporizer section in the cleaning step to achieve more effective cleaning.

Another aspect of the apparatus comprises: a liquid feed delivery path for flowing the liquid feed; a vaporization path disposed downstream of the liquid feed delivery path; and heating means for heating the vaporization path; wherein the vaporization path has a heat receiving area of not less than 2 $mm^2$ per 1 $mm^3$ volume of the liquid feed within the vaporization path.

According to the apparatus presented, a high surface-to-volume ratio of the capillary tube enables the production of necessary heat transfer so as to vaporize the liquid feed instantly and uniformly so that the liquid feed is not exposed to conditions which would be conducive to decomposition or degradation. The cross sectional shape of the liquid feed delivery path can be a circle, oval, rectangle, a polygon or any type of curved figure.

The vapor feed delivery path may be formed in the interior spaces of the capillary tube. Such a simple construction still allows the effects described above to be attained, including the feature of preventing plugging, low cost of manufacture, and ease of maintenance.

The vaporization path may comprise an annular cross section region. In this case, advantages are that the heat receiving surface area per unit volume of liquid feed is increased so that the distance between the liquid and the wall surface can be shortened, the vapor formation is improved by shortening the thermal distance to transfer maximum heat even in a laminar flow condition, and the cross sectional area is efficiently utilized to facilitate vapor formation. Other features include simple construction and low maintenance cost.

The vaporization path may comprise a vaporization enhancing region and a pressure absorbing region, the vaporization enhancing region having a larger heat receiving area than the pressure absorbing region.

The vaporization path may be formed by a core member having a cutout section extending in a feed flow direction. In this case, the overall apparatus operates at a lower pressure so that the vaporization efficiency is improved.

The core member may have a heating device so as to produce an additional advantage that the liquid feed can be heated from the inside as well as from the outside.

The heating means may provide heat from both interior and exterior of the vaporization path. In this case, the heat receiving area per unit volume of liquid feed is increased, and the thermal distance can be shortened.

Another aspect of the vaporization apparatus comprises: a liquid feed delivery path; a liquid feed delivery path for flowing the liquid feed; a vaporization path disposed downstream of the liquid feed delivery path; and heating means for heating the vaporization path. The vaporization path has a cross section where a maximum distance from any point of the vaporization path to a wall surface is not more than 2 mm.

In this case also, the cross sectional shape of the vaporization path can be a circle, oval, rectangle, polygon or any type of curved figure. Since the thermal distance is less than 2 mm, even if the flow is laminar, the heat can be transmitted instantly to vaporize the liquid feed without causing any chance for degradation.

Another aspect of the vaporization apparatus comprises: a liquid feed delivery path for flowing the liquid feed; a vaporization path disposed downstream of the liquid feed delivery path; and heating means for heating the vaporization path. The vaporization path has an expander section whose cross sectional area increases toward a downstream direction of the apparatus. Accordingly, the pressure in the vaporization path is lowered by decreasing the flow resistance in the secondary side of the vaporization path, thereby avoiding the pressure increase due to vapor formation and achieving efficient vaporization process.

The expander section may have an expansion angle of not more than 14 degrees, measured at a point of equivalent diameter. The pressure increase is thus avoided while maintaining heat transfer in the vaporizer section to produce efficient vaporization process.

The expander section may comprise not less than two stages, and an average expansion angle of a first stage is not more than 5 degrees and an average expansion angle of a second stage is not more than 14 degrees.

The expander section has a cross sectional profile residing in an area defined by formulas:

$$(r-r_0)/(r_1-r_0) \geq (L/L_1)^{10}$$

and $$(r-r_0)/(r_1-r_0) \leq (L/L_1)^2$$

where L is a distance from a start point of the expander section to any point; r is an equivalent radius of a cross section at a distance L; $L_1$ is a distance at an end point of the expander section from the start point of the expander section; $r_0$ is an equivalent radius of a cross section at the start point of the expander section; $r_1$ is an equivalent radius of a cross section at the end point of the expander section; and an angle formed by a tangent line at the start point of the expander section and a line "$r=r_0$" is not less than 0 degree and not more than 5 degrees. According to this design, a most efficient vapor forming process can be carried out in a shape formed by joining the endpoint of the radii. The equivalent radius is a radius of a cross section which is the same as another cross section surrounded by a loop.

Another aspect of the vaporization apparatus comprises: a liquid feed delivery path for flowing the liquid feed; a vaporization path disposed downstream of the liquid feed delivery path; and heating means for heating the vaporization path. The vaporization path comprises an annular cross section region.

The annular cross section region may be comprised of an outer tube having a circular or a rectangular cross section serving as a single loop path, and a core member disposed along a center section of the annular cross section region comprised of a core member or a plurality of core members. By appropriately selecting the outer radius of the core member, an annular space of desirable dimensions can be produced.

The core member may be designed to be movable in an axial direction of the outer tube. By moving the core member, adhered particles are loosened and together with the use of a cleaning agent, the interior spaces can be cleaned without disturbing the apparatus vacuum.

The core member may be made substantially removable from the vaporizer section to facilitate cleaning of the vaporization path by introducing a cleaning agent or carrier gas thereto. Thus, the vaporizer section, which is difficult to supply a large quantity of cleaning agent even if a high fluid pressure is applied, can be enlarged to allow a large quantity of cleaning agent to flow so that the cleaning time can be shortened.

The core member may be movable in the outer tube to enlarge the clearance between the core member and the outer tube so as to facilitate cleaning of the vaporization path by introducing a cleaning agent or carrier gas thereto. By providing the vaporization path with a tapered section, and by moving the core member toward an enlarging direction of the tapered section, the vaporizer clearance is increased to facilitate cleaning. The tapered section may be configured to enlarge in both upstream and downstream directions.

The core member may be provided with an internal heating device. This maybe achieved by forming a thermal medium passage, but simple embedding of an electrical heater is also acceptable.

The core member may be provided with an internal passage and nozzle holes for introducing a fluid substance into the vaporization path or the vicinity thereof. This is to enhance vapor formation, prevention of plugging and is helpful in cleaning the interior space of the apparatus by allowing a fluid substance, such as a solvent, carrier gas or cleaning substance to be sprayed into the interior of the apparatus, on a periodic basis or as required.

Another aspect of the vaporization apparatus comprises: a liquid feed delivery path for flowing the liquid feed; a vaporization path disposed downstream of the liquid feed delivery path; and heating means for heating the vaporization path. The heating means comprises a jacket member surrounding the vaporization path for receiving a fluid thermal medium therein. In such an apparatus, a fluid thermal medium having a sufficient thermal capacity is used to provide uniform heating of the jacket member by convective heating effects to avoid local hot or cold spots. As in other apparatuses, vapor formation is instantaneous and degradation of the liquid feed caused by local temperature rise is avoided. The jacket member may include a heater for heating the fluid thermal medium.

Thermal medium circulation passages may be provided in the jacket member so that flow inside the jacket member becomes a forced flow and more uniform heating may be achieved.

Another aspect of the vaporization apparatus comprises: a liquid feed delivery path for flowing the liquid feed; a vaporization path disposed downstream of the liquid feed delivery path; and heating means for heating the vaporization path. The apparatus is provided with a vaporization prevention section for preventing vaporization of the liquid feed flowing upstream of the heating means. In this case, steady production of high quality vapor feed is assured by preventing decomposition or degradation, of the in-transit liquid feed flowing in the upstream region of the apparatus, induced by the vaporization path.

The heating means may comprise a jacket member surrounding the vapor feed delivery path and a thermal medium housed in the jacket member.

The heating means may include a heater member disposed in a vicinity of the vaporization path.

The vaporization prevention section may be constructed so as to prevent heating effects of the vaporization path from affecting the in-transit liquid feed in the vaporization prevention section. It is also permissible to construct the apparatus so that the vaporization prevention section prevents pressure effects of the vaporization path from affecting the in-transit liquid feed in the vaporization prevention section.

The vaporization prevention section may include at least one of a constriction section, an orifice, a one-way valve or a shutoff valve. It may also include a one-way valve, having a drive means for pressing a valve member against a valve seat, disposed on an upstream side Another aspect is a vaporization apparatus for converting a liquid feed to a vapor feed comprising: a liquid feed delivery path for flowing the liquid feed; a vaporization path disposed downstream of the liquid feed delivery path; and heating means for heating the vaporization path, wherein a substance entry path for delivering substances including carrier gas, solvent or cleaning agent is merged with either the liquid feed delivery path or the vaporization path.

The substance entry path may be merged with either the liquid feed delivery path or the vapor feed delivery path at a location upstream of the vaporization prevention section. The substance entry path may also be merged with either the liquid feed delivery path or the vapor feed delivery path at a location between the vaporization prevention section and the vaporizer section.

The substance entry path may be merged with an exit opening of the vaporization path. This arrangement is particularly desirable because, when the carrier gas is introduced only through the vaporization path, the available opening area is small so that there is an absolute limit to the quantity of gas which can be admitted. By letting the carrier gas flow in from an expanded opening at the exit of the vaporization path, a larger volume of carrier gas maybe admitted to more effectively vaporize unvaporized feed which may be present in the vaporization path. Also, during cleaning, if the cleaning agent is introduced only from the inlet of the vaporization path, stagnant regions may be produced in the regions of enlarged path, and unvaporized feed may not be cleaned out thoroughly. In this case, a large quantity of cleaning agent can be admitted to enable more thorough cleaning.

The substance entry path may be merged so as to oppose the vaporization path. In this case, the entry path pipe can be disposed in a region where there is a large cross sectional opening, so a large diameter pipe can be used to deliver a large quantity of cleaning agent. Also, because the pipe can be disposed near the center of the vaporizer section, more even distribution of the solution is possible.

Another aspect of the invention is that a vaporization apparatus for delivering a vapor feed to a processing chamber comprises a vaporizer section for vaporizing a liquid feed to, wherein an outlet port of the vaporizer section comprises an upward slanted section being slanted upward toward downstream. In this case, it is possible to prevent unvaporized liquid feed or re-condensed liquid feed to flow toward the deposition chamber.

In another aspect of the invention, the vaporization apparatus comprises: a gas dissolution section for dissolving an inert gas in a liquid feed; a vaporizer section for vaporizing the liquid feed; and a liquid feed delivery path for transporting a liquid feed from the gas dissolution section to the vaporizer section while retaining the inert gas dissolved in the liquid feed.

In this apparatus, when the liquid feed is vaporized in the vaporizer section, the dissolution capacity is decreased upon the formation of vapors, and the inert gas is separated. The sites for vapor formation and gas separation are proximal, so that the partial pressure of the vapor feed is definitely lowered, and the vaporization efficiency can be increased without disturbing the contact between the liquid feed and the heating section. It is also desirable that the gas dissolution section operates at an inert gas partial pressure of not less than 6 kgf/cm$^2$G.

A pressure shielding device may be disposed between the liquid feed delivery path and the vaporizer section. In this case, dissolved inert gas is held in the liquid feed until it reaches the vaporizer section, or, in the case of a vaporizer section having a low temperature zone and a heating zone, dissolved gas is retained just prior to entering the heating zone, so that sudden gas separation can be induced to further improve the vaporization efficiency.

The gas dissolution section may include a vapor-liquid mixing device for enhancing contact of the inert gas with the liquid feed. Some examples of vapor-liquid mixing devices include bubbling of gas, stirring of liquid and ejecting of gas in the liquid.

Another aspect of the invention is directed to a gas ejection device comprising a vaporizer section for vaporizing a liquid feed to produce a vapor feed, said vaporizer section having a capillary tube and a heating device surrounding said capillary tube, and an ejection head for ejecting vapor feed toward a substrate positioned in a processing chamber. The vaporizer section and the ejection head are made as a thermally integral unit. In this apparatus, a combination of a capillary tube and a high temperature heat exchanger efficiently vaporizes the liquid feed. At the same time, the vapor feed can be delivered to the processing chamber without being subjected to temperature changes during transit so that a high quality film deposition may be produced under stable thermodynamic conditions.

In the apparatus presented above, the vaporizer section and the ejection head may be housed in a common casing. In this case, vaporized feed is delivered to the gas ejection head in a shortest possible path, without having to pass through pipings, so that the vapor feed can be delivered to the processing chamber without being subjected to premature degradation or precipitation reactions. It is also permissible that the casing is provided with a common thermal medium passage. Such a construction permits a simple ejection head which is capable of maintaining a desired temperature.

In the device presented above, a quality degradation prevention means may be provided to prevent the quality of in-transit liquid feed in an upstream region of the heating means from being affected by heating effects of the heating means. In this case, heating effects of the high temperature heat exchanger disposed in an upstream region of the apparatus can be prevented from degrading the quality of the pre-vaporization liquid feed.

The vaporizer section and the ejection head may share a common flow adjusting space serving a dual function of absorbing expansion effects of a vapor feed produced from a liquid feed and distributing the vapor feed to a plurality of nozzle holes in the ejection head. In this case, the vaporized feed is admitted into a thermally unified flow adjusting space, and is directly ejected onto the substrate. Therefore, the vapor feed does not need to travel through extra path before entering into the processing chamber, so that the quality of the vapor feed is maintained and plugging is prevented.

The flow adjusting space may be formed in a cone shape. In addition, the flow adjusting space may be communicated with a process gas delivery passage. In such an apparatus, the kinetic energy of the descending gas can be utilized to produce uniform mixing of feed vapor itself or feed vapor and an oxidizing gas or feed vapor and a carrier gas.

Another aspect of the gas ejection device comprises a vaporizer section, having a heating device surrounding a capillary tube for transporting a liquid feed. The vaporizer section communicates with an ejection head for ejecting vapor feed toward a substrate positioned in a processing chamber. The vaporizer section and the ejection head are housed in a thermal insulation cover unit. The same advantages as described above are obtained while maintaining the simplicity of construction.

BRIEF DESCRIPTION OF THE DRAWINGS

FIG. 4 is cross sectional view of an embodiment of the vaporizer section of the present invention.

FIGS. 5A~5D are cross sectional views of other examples of the vaporizer section.

FIGS. 8A & 8B are cross sectional views of still further examples of the vaporizer section.

FIG. 26 is an example of the gas dissolution device in liquid feed.

FIG. 27 is another example of the gas dissolution device in liquid feed.

FIG. 28 is another example of the gas dissolution device.

FIG. 29 is another example of the gas dissolution device.

DETAILED DESCRIPTION OF THE INVENTION

The present invention will be explained in the following with reference to the drawings. The vaporizer section of the present invention is notably effective in producing vapors from a liquid feed made by dissolving organometallic compounds of substances such as titanium, barium, strontium, lead, zirconium, bismuth, tantalum, niobium and lanthanum, in organic solvents. In the following presentation, upstream and downstream are terms used to denote any location within the system relative to the feed source 10 (upstream) and the spent gas discharge opening (downstream).

Figure 1:
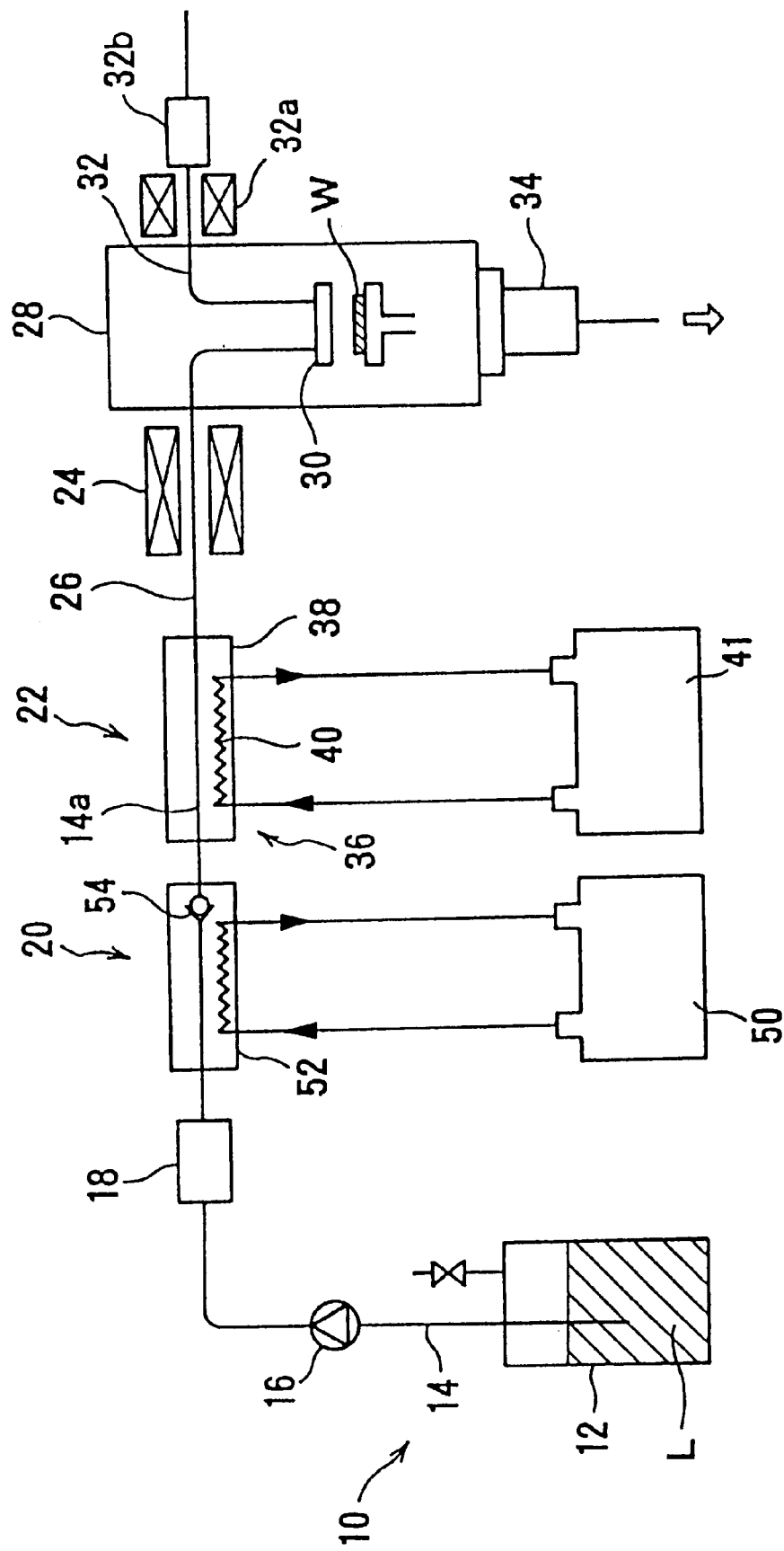
FIG. 1 is an overall schematic view of a thin film deposition system based on the vaporization apparatus according to a first embodiment of the present invention.

FIG. 1 shows an overall view of a chemical vapor deposition system including the vaporizer section of the present invention. The apparatus comprises a liquid feed supply source 10 including a feed storage 12 for a liquid feed L; a feed pipe 14 connected to the supply source 10; and a feed delivery facility comprising a feed pump 16 and a flow controller 18 for providing a fine control of the flow rate and smoothing of the flow pulsations.

Along the feed pipe 14 on the downstream side of the flow controller 18, there is provided a vaporization prevention section 20. Immediately downstream of this section, there is a vaporizer section 22 for instantly vaporizing a liquid feed by exposing the liquid feed L to high temperature and low pressure. The vaporizer section 22 communicates with a feed gas ejection device 30 provided within the processing chamber 28 by way of a gas delivery pipe 26 which is heated by a heater 24. The gas ejection device 30 communicates with a reactant gas (oxidizing gas) delivery pipe 32 having a heater 32a and a flow adjuster 32b.

Figure 2A:
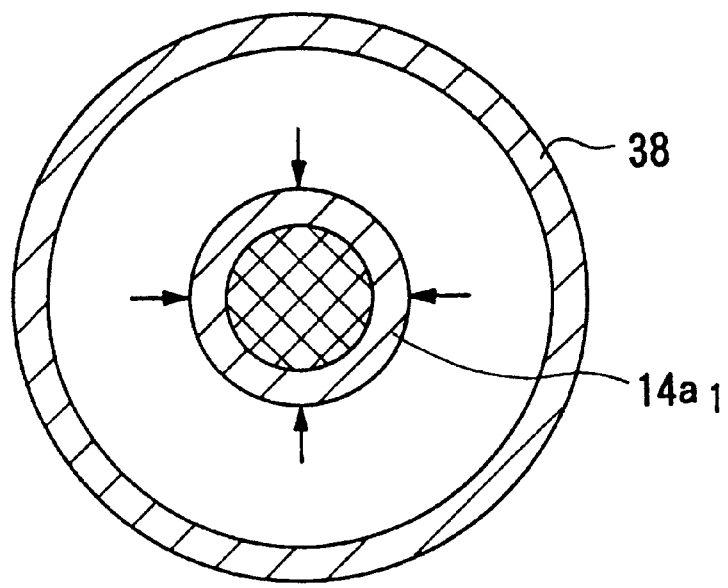
FIG. 2A is a cross sectional view of the heating section in the vaporizer section shown in FIG. 1.

The vaporizer section 22 includes a heating section 36 made as a jacket heater in which a high temperature thermal medium is contained so as to supply a large volume of steady heat. As shown in FIG. 2A, the heating section 36 comprises a capillary tube 14a penetrating through the jacket heater 38 so as to provide a large heat receiving area per unit volume of liquid feed (heat receiving area ratio). The thermal medium may be a high thermal capacity oil, and as shown in FIG. 1, it is heated by a high temperature heat exchanger 40 provided within the jacket heater 38 which receives heat from heating source 41. The vaporizer section 22 is maintained at a low pressure by a vacuum pump 34 disposed downstream of the film deposition chamber 28.

Figure 3A:
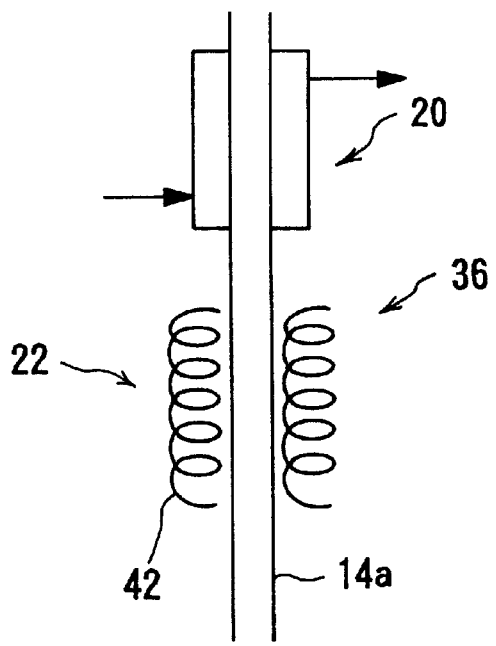
FIGS. 3A & 3B are other examples of the heating section of the vaporizer.
Figure 3B:
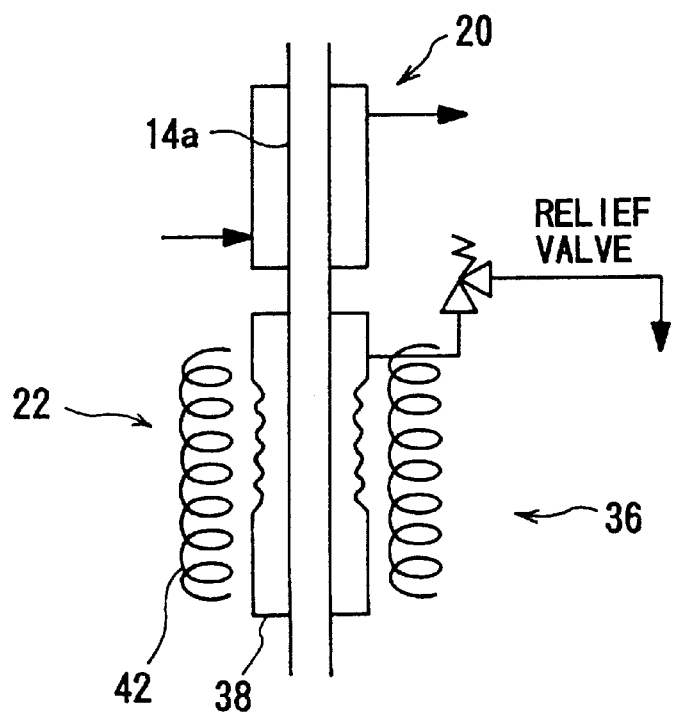

Several examples of the construction of the heater section 36 are shown in the following. In FIG. 3A, the capillary tube 14a is heated by a heater 42 without using a jacket-type heater; in FIG. 3B, an external heater 42 is used to heat the medium flowing in the jacket heater 38. As shown in FIG. 4, it is also possible to utilize an external tank 44 for heating the medium, and circulating the heated medium to the jacket heater 38 through a pump 46 and a circulating path 48. By adopting such designs, it becomes possible to provide sufficient heat to the vaporizer section 22 while minimizing the adverse heating effects on the vaporization prevention section 20.

In the construction of the heating section presented above, the heat receiving surface area S per unit volume of fluid V is, if "d" is the inside diameter of the capillary tube 14a and "S=πd" is the heat receiving area per unit length; and the volume of the fluid V=πd²/4, then a ratio $H_1$ can be expressed as:

$$H_1 \, S/V = 4/d.$$

Therefore, the quantity of heat increases inversely proportionally to d. When d is 2 mm or less, vaporization can be carried out sufficiently quickly to provide good results.

Figure 34:
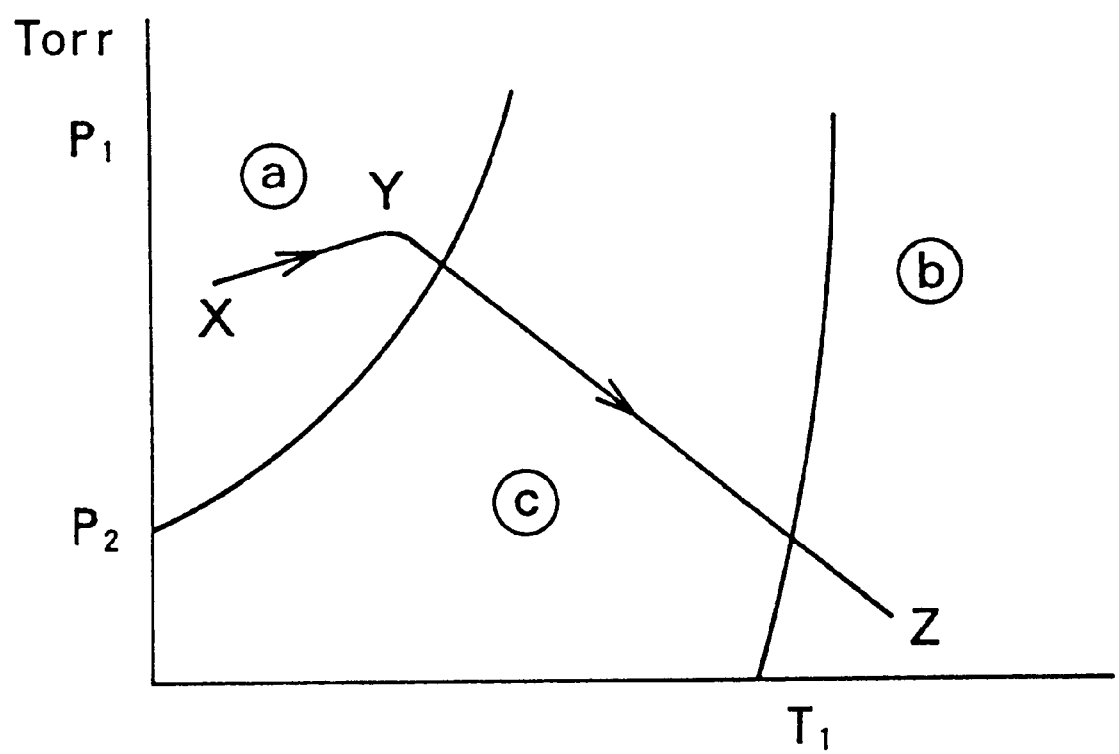
FIG. 34 is a schematic illustration of the phase diagram of the material used in the chemical vapor deposition apparatus.

The vaporization prevention section 20 functions as a preparing section for preparing the liquid feed to be instantly vaporized in the vaporizer section 22 while suppressing decomposition or degradation of the liquid feed L until it is delivered into the vaporizer. The vaporization prevention section 20 includes a low-temperature heat exchanger 52 which receives a fluid at a given temperature from a constant-temperature tank 50. According to this design, the feed pipe 14 inside the low-temperature heat exchanger 52, one-way valve 54 and the liquid feed L can be kept at a temperature Ty, for example, for a point Y shown in FIG. 34, regardless of the changes in the surrounding temperatures. The one-way valve 54 prevents the negative pressure on the vaporizer section side to adversely affect the control.

The operation of the vaporizer section will be explained next. The liquid feed L stored in the feed storage 12 is forwarded by the feed pump 16 to the flow controller 18 along the feed pipe 14, so as to control the flow rate and smooth out the pulsations. The liquid feed L then enters the vaporization prevention section 20 where it is maintained at a temperature Ty and pressure Py. This preparatory temperature is chosen so as not to let the liquid feed undergo decomposition or degradation, but to enable it to still reach the vaporization temperature quickly once it is delivered into the vaporizer section 22.

The liquid feed L entering the vaporizer section 22 goes into a high temperature heat exchanger 40 having a double-wall structure comprising the capillary tube 14a and the outer pipe (jacket) 38. In this type of arrangement, a large quantity of heat can flow from the high temperature thermal medium inside the jacket heater 38 to the liquid feed L through the capillary tube. Therefore, the temperature of the feed liquid L rises instantly, and also, its pressure drops rapidly due to the effect of the vacuum pump 34 disposed downstream. The result is that the liquid feed vaporizes while it is reaching a point Z in the vaporization region shown in FIG. 34.

The low-temperature heat exchanger 52 of the vaporization prevention section 20 and the high-temperature heat exchanger 40 of the vaporizer section 22 are disposed very close to each other with a small separation space, and a steep temperature gradient exists in the feed pipe 14 in this region. Therefore, the liquid feed L passes through the region (c) of FIG. 34 instantly leading to complete vaporization in region (b) without degradation or premature vaporization of the solvent, and the vapor feed of a correct composition and uniformity is delivered to the substrate within the processing chamber 28.

Figure 2B:
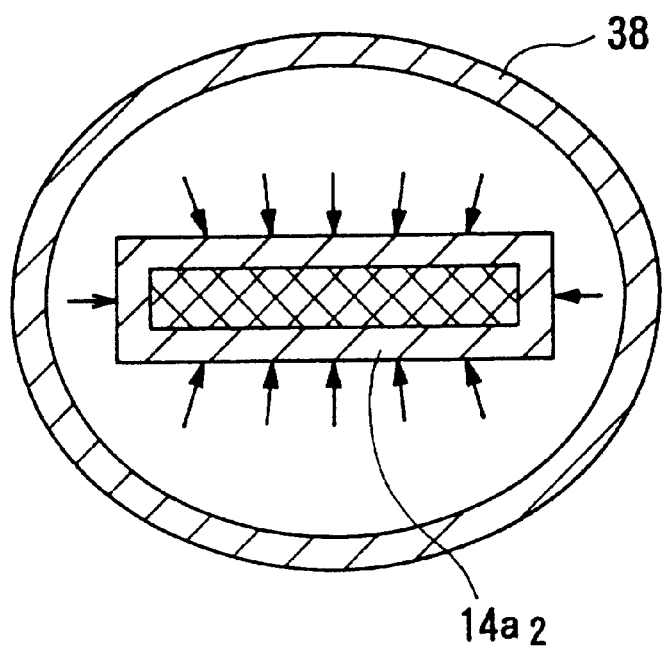
FIG. 2B is another example of the vaporizer section of FIG. 1.

In the above embodiment, the feed path was constituted by the capillary tube 14a1 as shown in FIG. 2A, but it is permissible to use a flat rectangular tube 14a2, such as the one shown in FIG. 2B. Both of these shapes are effective in increasing the flow volume of the liquid feed while maintaining the same quick heating effect. Also, in this embodiment, there is one liquid feed L and one feed storage 12, but it is possible to arrange a plurality of feed storages 12 storing liquid feed L, and after mixing the liquids L in a mixer (not shown), the mixed liquid feed is delivered to the vaporization prevention section 20 and then to the vaporizer section 22 to ultimately deliver mixed vapor feed to the processing chamber 28.

Figure 5A:
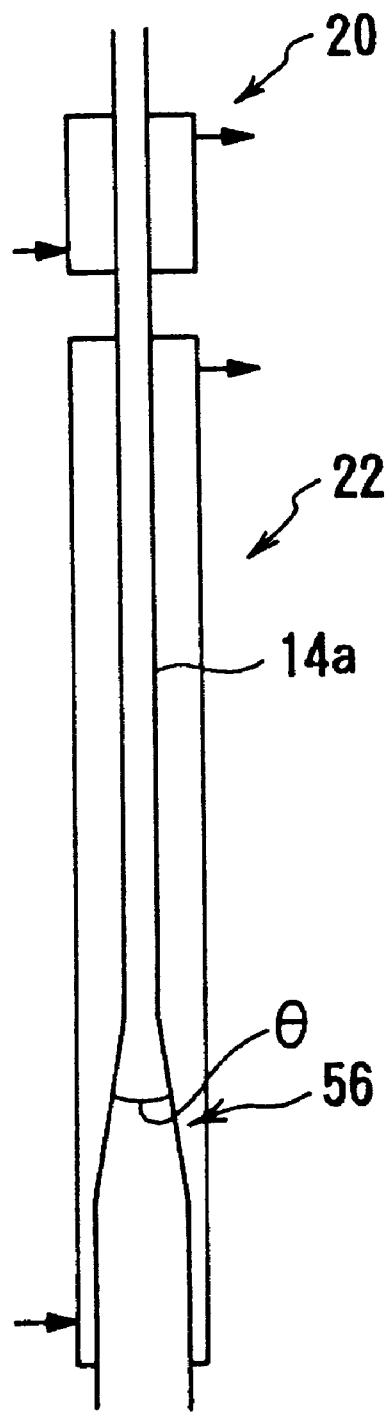
Figure 5B:
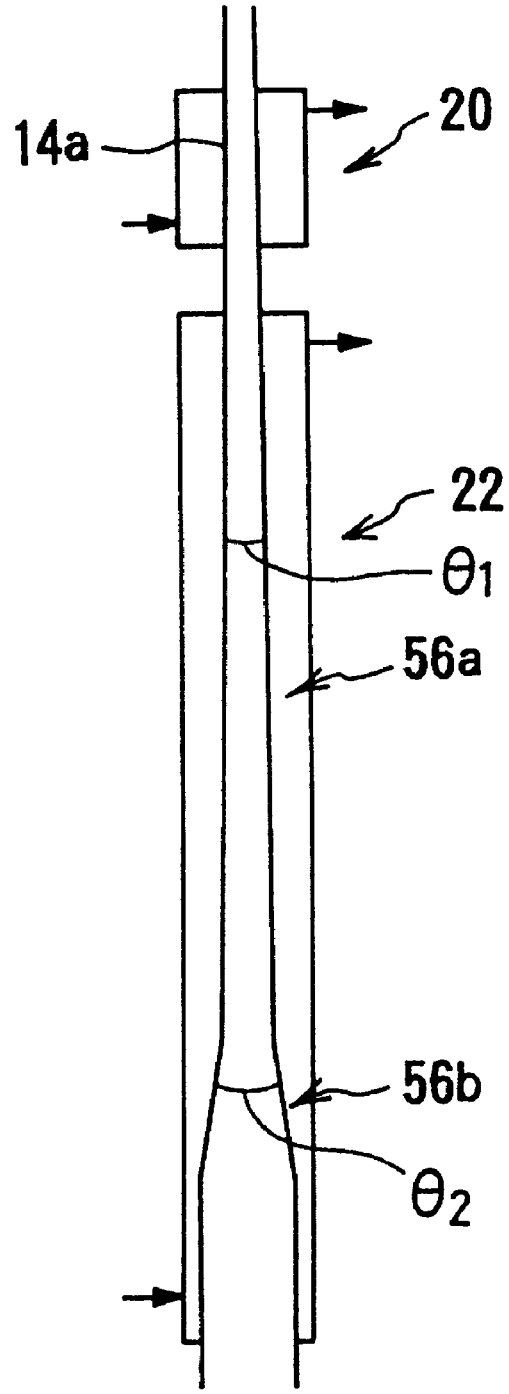

FIG. 5A shows another embodiment of the vaporizer section. This device has an expander section 56 in which the diameter of the capillary tube 14a in the vaporizer section 22 gradually expands in the downstream portion of the apparatus. The expander section 56 is designed so as to prevent difficulty in vaporization brought about by a pressure rise which would occur if the diameter remains constant throughout the vaporizer as the liquid feed L therein becomes heated. It also serves to control the temperature changes due to adiabatic expansion by smoothly expanding the volume of the feed pipe while suppressing pressure loss of the vapor feed. Therefore, the expander section 56 is best located at a location in the vaporizer where the liquid feed begins to expand by gaining necessary latent heat after having gained sensible heat in the linear section to reach the vaporization temperature. If the rate of path expansion is too extensive, heat supply from the capillary tube wall may be insufficient to complete vapor formation, so that vaporization efficiency may become inferior. Therefore, the angle q of the expander section 56 should be less than 14 degrees, and preferably less than 5 degrees. FIG. 5B shows a two-stage expander section 56a, 56b, and the respective angles $q_1$ for stage 1 should be less than 5 degrees and $q_2$ for stage 2 should be less than 14 degrees.

FIG. 5C shows another embodiment of the expander section 56c where the diameters shown in the cross sectional view increase gradually toward the exit. Accordingly, by adopting a stepwise or continuous change in the inside diameter, it is possible to prevent sudden changes in the pressure of the liquid feed to produce an efficient vaporization process. In this embodiment, the profile of the expander section 56c in a cross sectional view is designed to reside in a region surrounded by curves $C_1$ and $C_2$, which is shown by shade lines in FIG. 5C. The area is defined by formulas:

$$(r-r_0)/(r_1-r_0) \geq (L/L_1)^{10}$$

and $$(r-r_0)/(r_1-r_0) \leq (L/L_1)^2$$

where L is a distance from a start point $P_0$ of the expander section 56c to any point P; r is a radius of a cross section at a distance L; $L_1$ is a distance at an end point $P_1$ of the expander section 56c from the start point $P_0$; $r_0$ is a radius of a cross section at the start point $P_1$; $r_1$ is an equivalent radius of a cross section at the end point $P_1$.

As shown in FIG. 5D, an angle $\theta_0$ formed by a tangent line at the start point $P_0$ of the expander section 56c and a line "$r=r_0$" is not less than 0 degree and not more than 5 degrees so that the expander section 56c smoothly succeeds the straight portion of the vaporizer section 22. According to this design, most efficient vapor forming process can be carried out in a shape formed by joining the endpoint of the radii.

In this embodiment, the vaporizer section 22 is profiled to have a circular cross section. However, the expander section having other cross sections such as an ellipse or a rectangle may also have a gradually increasing diameters. In this case, an equivalent radius is used instead of the actual radius. The equivalent radius r is defined by a formula:

$$r=(A/\pi)^{1/2}$$

where A is a cross sectional area at L.

Figure 6A:
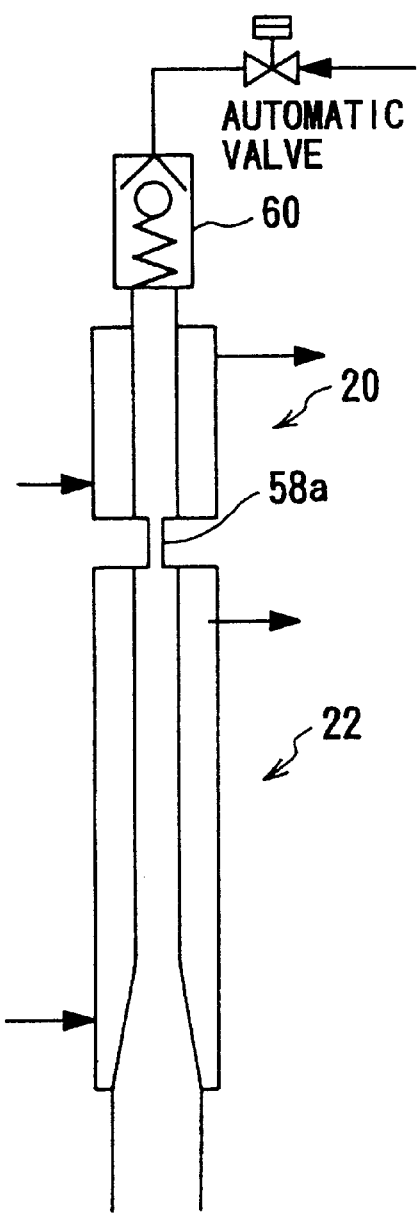
FIGS. 6A & 6B are cross sectional views of still other examples of the vaporizer section.
Figure 6B:
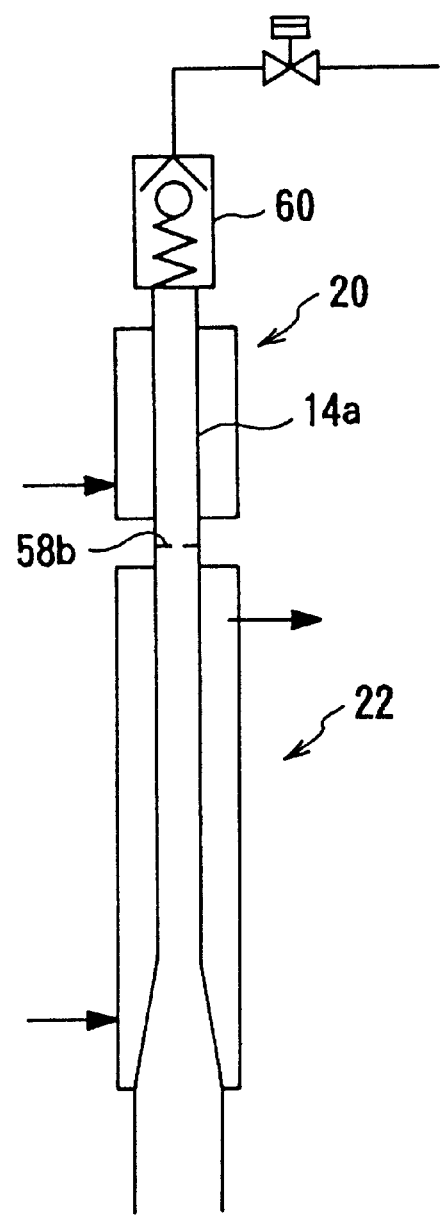

FIGS. 6A, 6B show another embodiment for preventing the pressure effects of the vaporizer section 22 from affecting the performance of the vaporization prevention section 20. FIG. 6A shows a constricted capillary tube 58a having a narrowed neck in the capillary tube between the vaporizer section 22 and the vaporization prevention section 20. FIG. 6B shows a case of replacing the capillary tube with an orifice 58b. It is clear that such constriction sections 58a, 58b are effective in buffering the effect of pressure in the vaporizer section 22 from affecting the performance of the vaporization prevention section 20. Also, in both cases, one-way valve 60 is provided on the upstream side of the vaporization prevention section 20, and by setting the threshold value suitably, it would be possible to achieve the same effect.

Figure 7A:
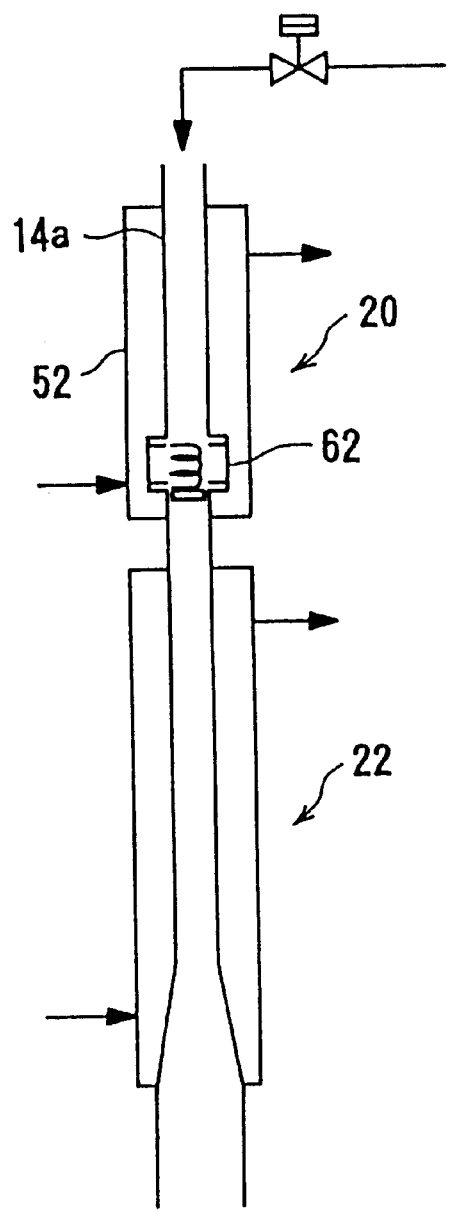
FIGS. 7A & 7B are cross sectional views of further examples of the vaporizer section, and FIG. 7C relates to a contrasting arrangement.
Figure 7B:
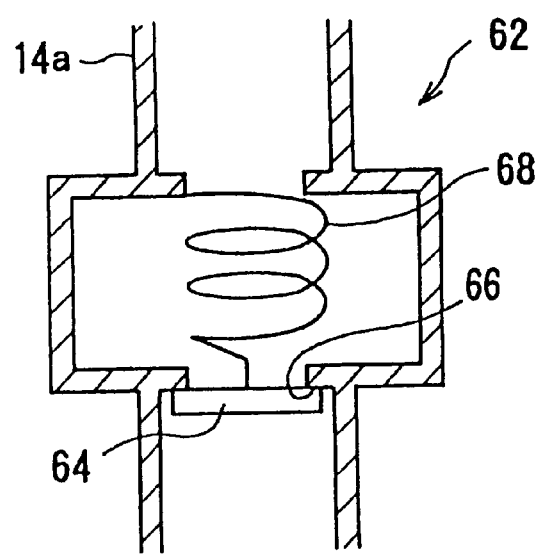
Figure 7C:
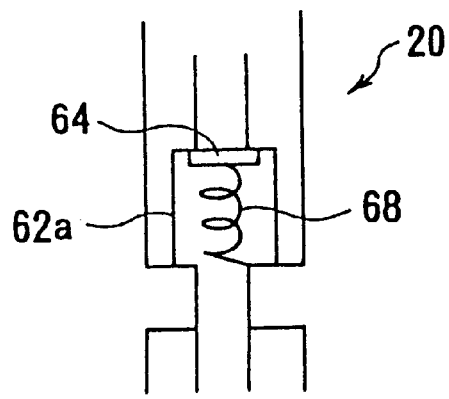

FIG. 7A shows another embodiment in which, in the vaporization prevention section 20, a one-way valve 62 is provided on the capillary tube 14a in the low-temperature heat exchanger 52. This one-way valve 62 has an elastic spring member 68 which biases the valve member 64 in tension, as shown in FIG. 7B, toward the upstream side of the flow path so that the valve member 64 is pressed against the valve seat 66. This design is to be contrasted with the one shown in FIG. 7C in which the one-way valve 62a utilizes a compressive force of the spring member which is disposed downstream side of the valve member 64, resulting in the liquid feed L about the spring to cause stagnation in a location which is vulnerable to the thermal and pressure effects of the vaporizer section 22. The designs shown in FIGS. 7A or 7B are superior because it they are able to prevent the formation of stagnation and consequent degradation in the quality of the liquid feed L.

Figure 9:
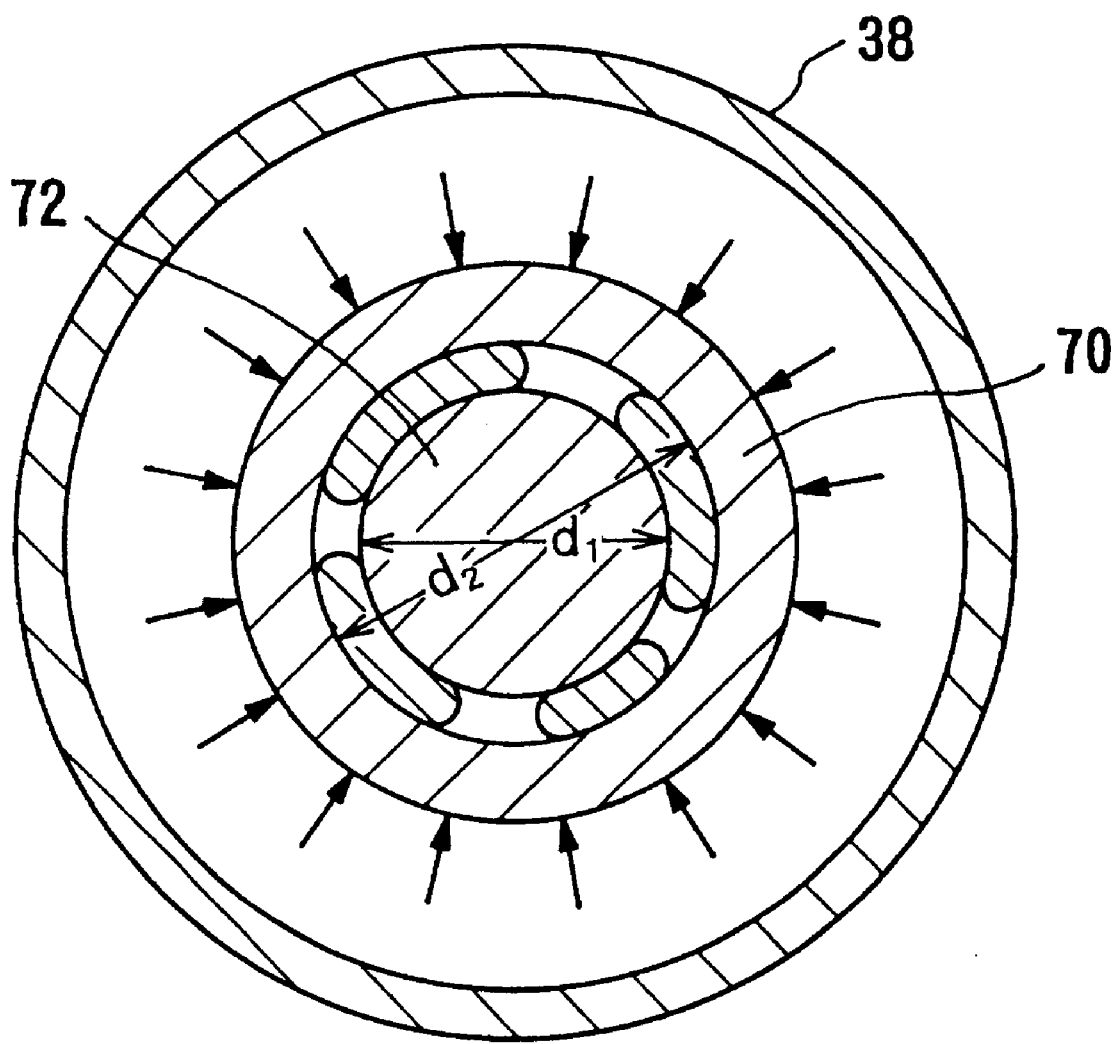
FIG. 9 is a cross sectional view seen through a plane A—A in FIG. 8A.

FIGS. 8A, 8B show another embodiment, in which the delivery path 14 comprises an outer tube 70 and a core member 72 having a minute clearance space therebetween. A ring-shaped cross sectional view of the delivery path 14 is shown in FIG. 9. The outer diameter of the core member 72 is $d_1$, the inner diameter of the outer tube 70 is $d_2$, then the heat receiving area ratio $H_2$ to designate the heat receiving surface area of the capillary tube per unit volume of liquid feed is proportional to the ration of heat receiving area "$S=\pi d_2$" to the fluid volume "$V=\pi(d_2^2-d_1^2)/4$"; therefore, $$H_2 \propto S/V = 4d_2/(d_2^2-d_1^2).$$

Because ($d_2 \cong d_1$), $$H_2 \propto S/V \cong 2/(d_2-d_1),$$

so that the ratio increases approximately inversely proportionally to the difference in the radii ($d_2-d_1$). This design permits a higher vaporization efficiency to be obtained compared with the simple capillary tube 14a shown in FIG. 1, while maintaining the cross sectional area of the liquid path to retain the vapor volume. The design shown in FIG. 8B corresponds to a two-stage expander section shown in FIG. 5B.

Figure 10A:
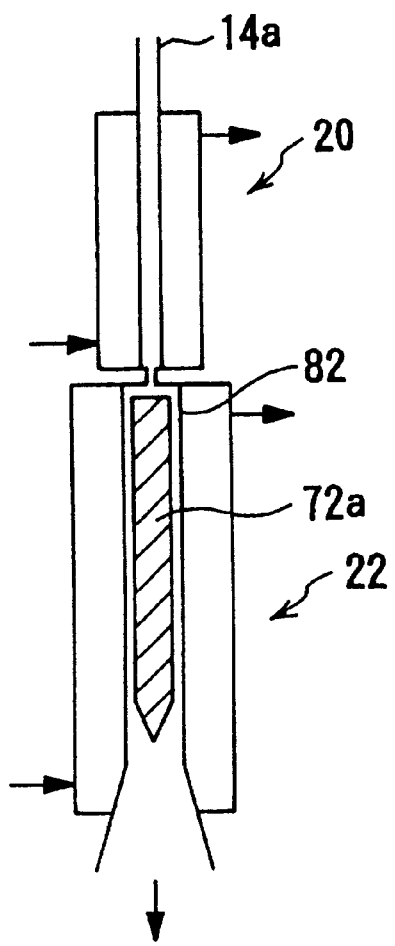
FIGS. 10A & 10B are cross sectional views of tapered core sections in the vaporizer section.
Figure 10B:
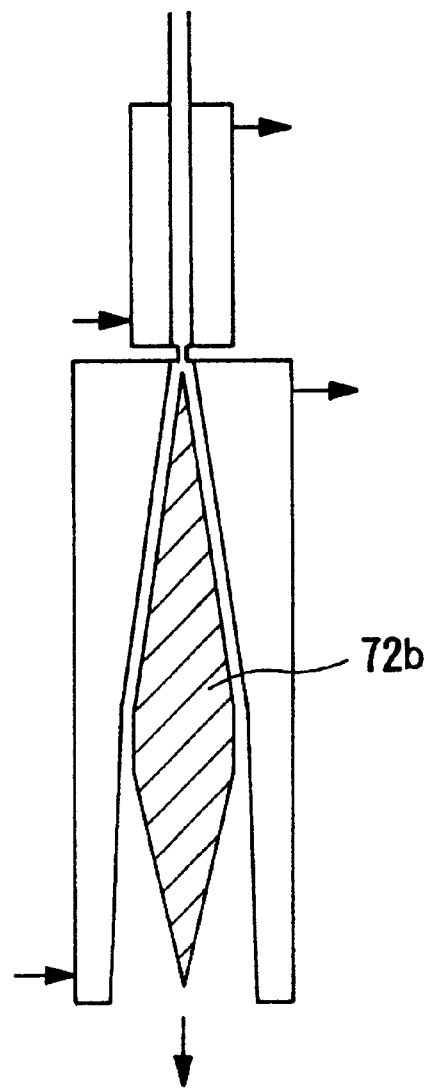

FIG. 10A shows a straight core member 72a provided in the vaporizer section 22 and FIG. 10B shows a case of a cone-shaped core member 72b in the same section. The design shown in FIG. 10B controls the pressure increase without increasing the path width, thereby providing an effective vaporization and enabling heat to be supplied smoothly without increasing the ratio H.

Figure 11A:
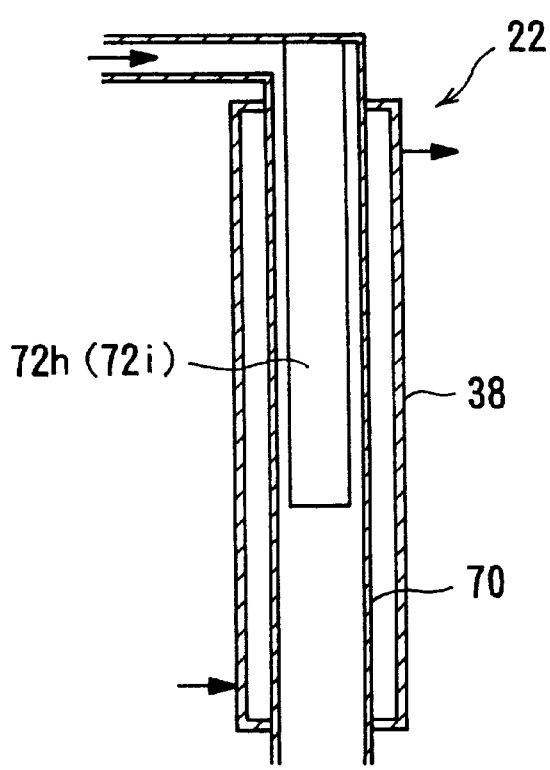
FIG. 11A is a longitudinal cross sectional view.
Figure 11B:
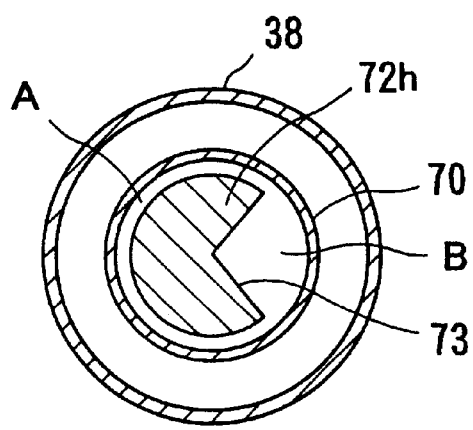
FIGS. 11B~11C are transverse cross sectional views of a core type vaporizer section.
Figure 11C:
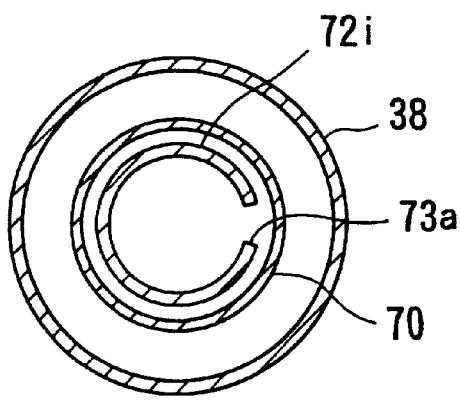

FIGS. 11A to 11C show variations in the core shape, having a cutout section made along the flow direction. The core member 72h in FIG. 11B has a fan-shaped cross sectional cutout section 73 of a given inclusive angle. FIG. 11C shows a case of a core member 72i having a cutout section 73a having an inward opening. These types of designs of the vaporizer section 22 provide a vaporization promotion region A constituted by narrowly spaced region and a pressure buffer region B constituted by a wide passage. The design is effective in dispersing the pressure increase throughout the vaporizer section so that even if a sudden increase in vapor formation should occur in the region A, the pressure increase can be moderated by the pressure buffer region B, thereby achieving an increase in the vaporization efficiency.

Figure 12:
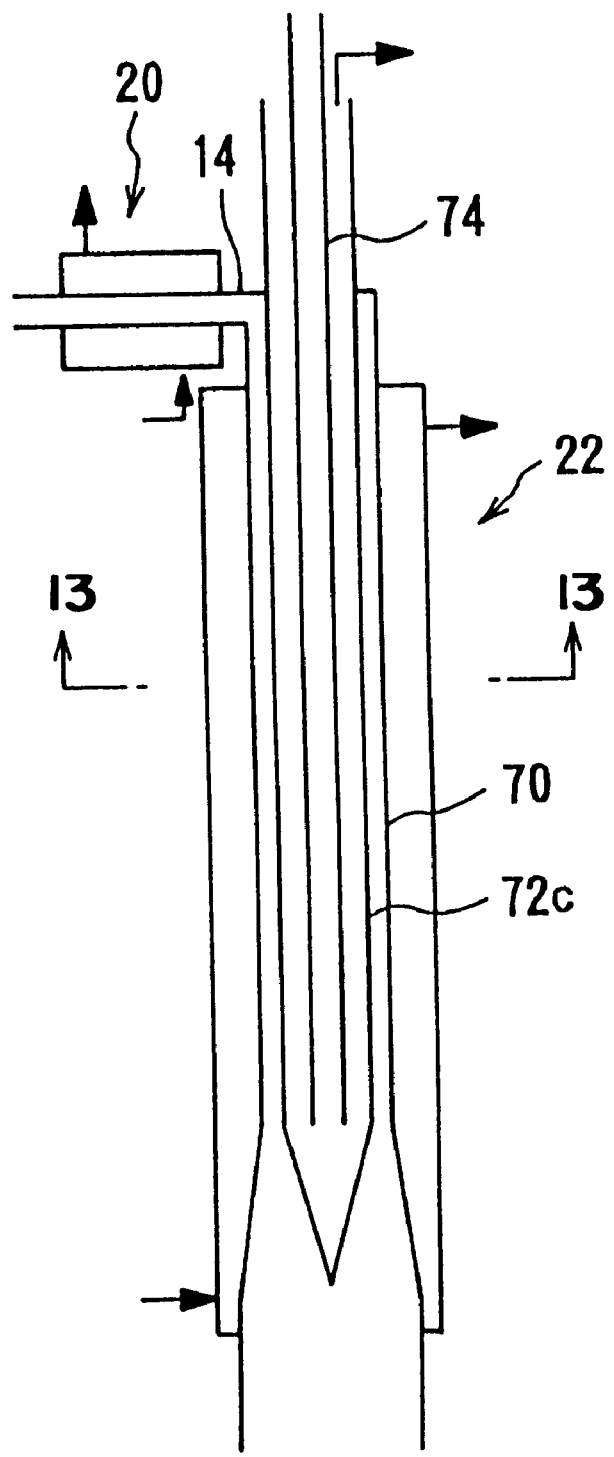
FIG. 12 is a cross sectional view of another embodiment of the vaporizer section.
Figure 13A:
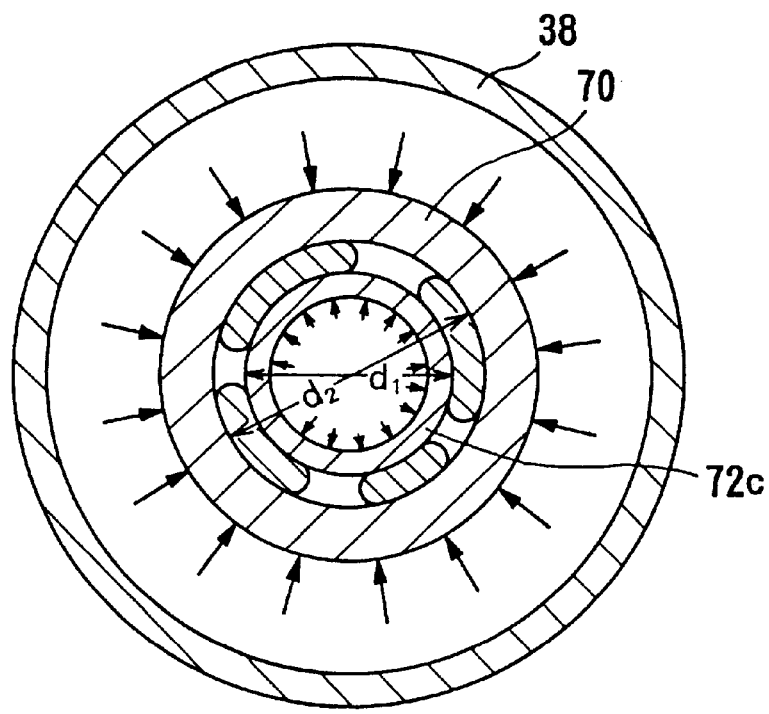
FIGS. 13A & 13B are transverse cross sectional views through the plane A—A of the vaporizer section shown in FIG. 12.

FIG. 12 shows another embodiment where a fine tube 74 is inserted inside the core member 72c to form another thermal medium flow passage so that the liquid feed L in the fluid passage 14 is heated from both the inside wall and the outside wall of the passage. In this example, to prevent interference with the thermal passage of the core member 72c, the delivery path 14 between the vaporization prevention section 20 to the vaporizer section 22 is bent at 90 degrees. The heat receiving area ratio $H_8$ in this case is proportional to the area "$S=\pi(d_2+d_1)$" and volume "$V=\pi(d_2^2-d_1^2)/4$", as shown in FIG. 13A; therefore, $$H_2 \propto S/V = 4(d_2+d_1)/(d_2^2-d_1^2) = 4/(d_2-d_1).$$

Figure 13B:
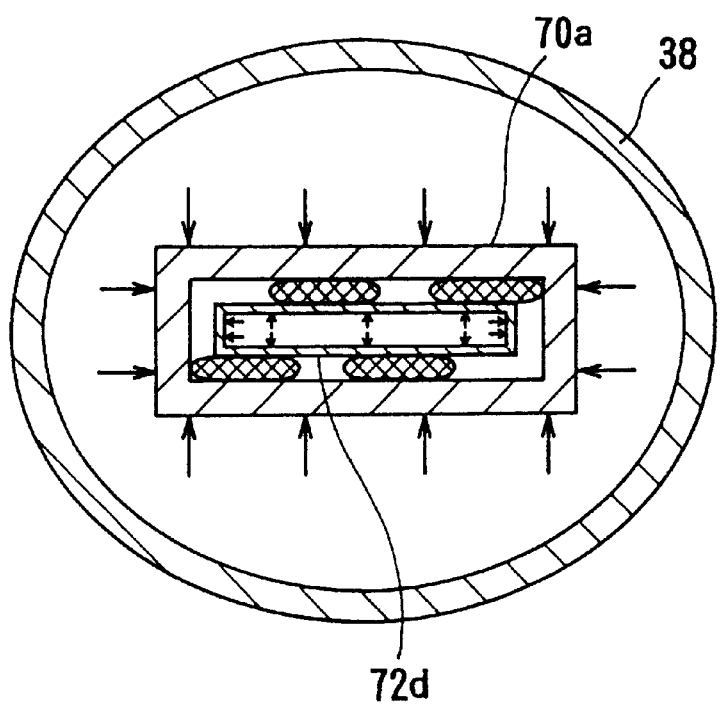

It can be seen that the vaporization efficiency in this case is double that of the case shown in FIG. 9. FIG. 13B shows a case of forming the tube 70a and the core member 72d into a rectangular shape. This design permits a higher flow rate while retaining the same heating effect.

Figure 14:
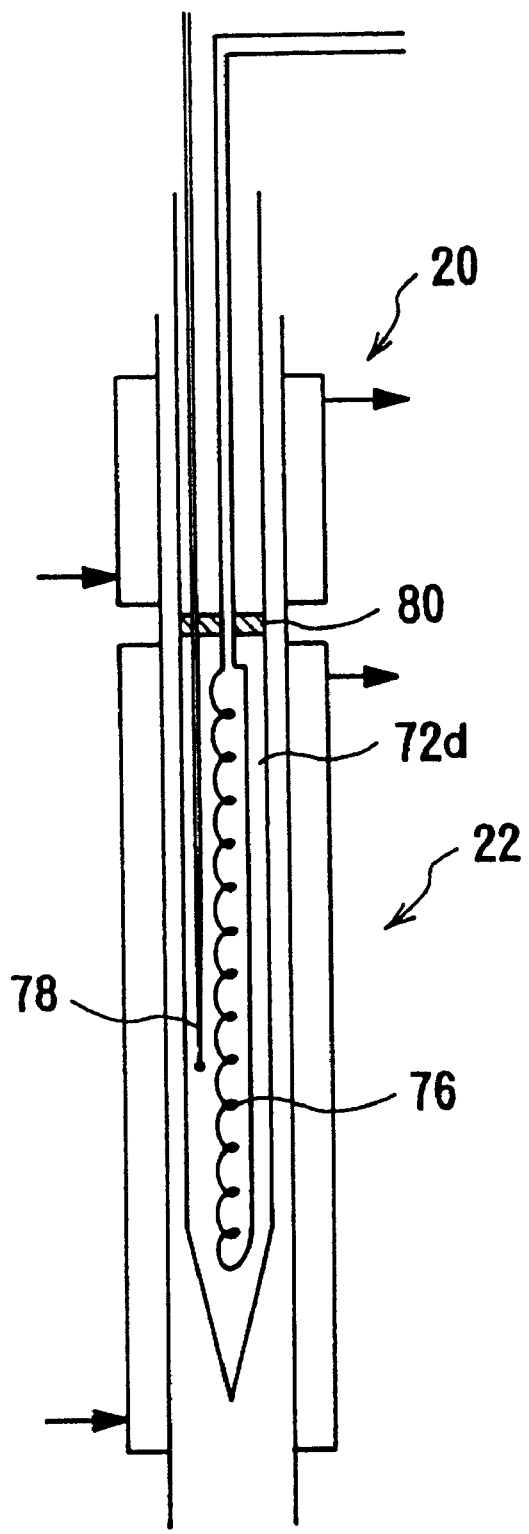
FIG. 14 is another heater type of vaporizer section.

FIG. 14 shows another example of providing heat to the liquid feed L from outside and inside a ring-shaped flow path, in which a heater 76 and a temperature sensor 78 are provided inside the core member 72d in the vaporizer section 22. In this case, the core member 72d is also arranged to pass through the vaporization prevention section 20. However an insulation material 80 is provided between the vaporizer section 22 and the vaporization prevention section 20 to prevent heat exchanges therebetween. This arrangement is convenient because an electrical wire can be used in place of a tube so that the construction is simplified and fine control over the temperature can be exercised by using a sensor 78.

Figure 15A:
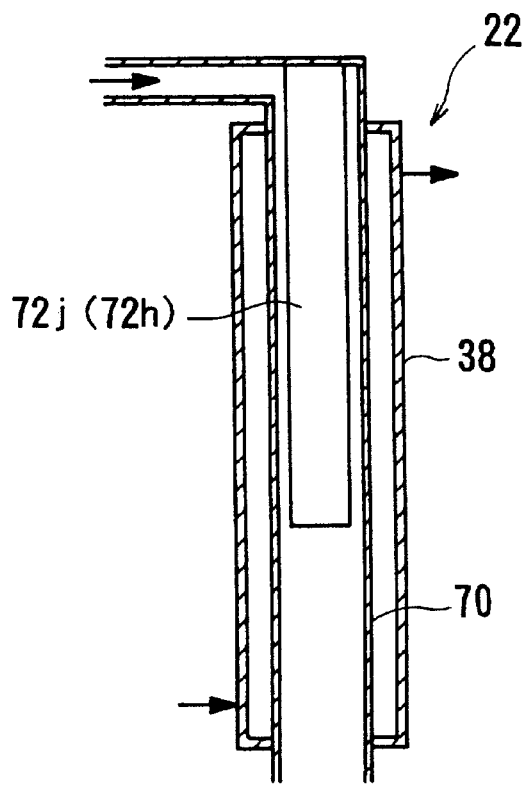
FIG. 15A is a longitudinal cross sectional view.
Figure 15B:
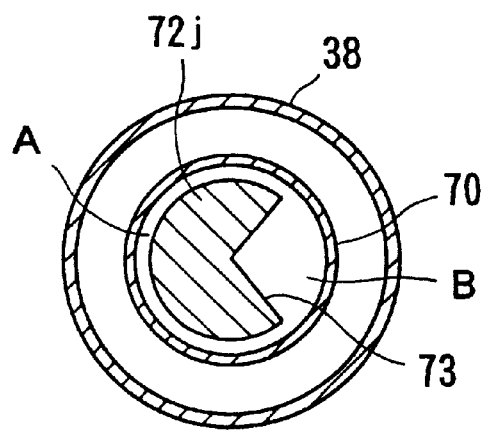
FIGS. 15B~15C are transverse cross sectional views of another core type vaporizer section.
Figure 15C:
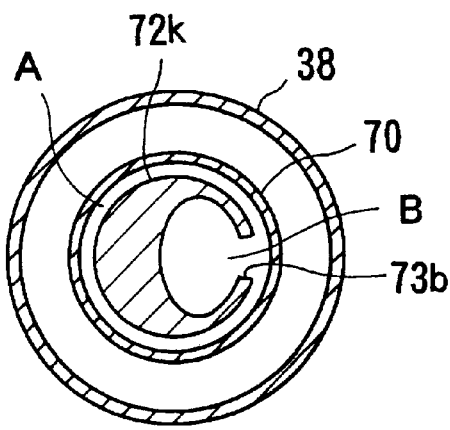

FIGS. 15A to 15C show variations in the shape of the core member having an internal heater shown in FIG. 14. In this case, the core member has a cutout section made in the direction of the fluid flow. In FIG. 15B, the core member 72j has a cutout section 73 having a fan-shaped cross section of a given inclusive angle. In FIG. 15C, the core member 72k has a tube-shaped cutout section 73b with an inward opening. These designs thus provide both the vaporization promotion region A and the pressure buffer region B. By heating the liquid feed L from inside as well as from outside the fluid path, any rise in pressure in region A is absorbed in region B, thereby lowering the pressure throughout the vaporizer section to increase the vaporization efficiency.

Figure 16A:
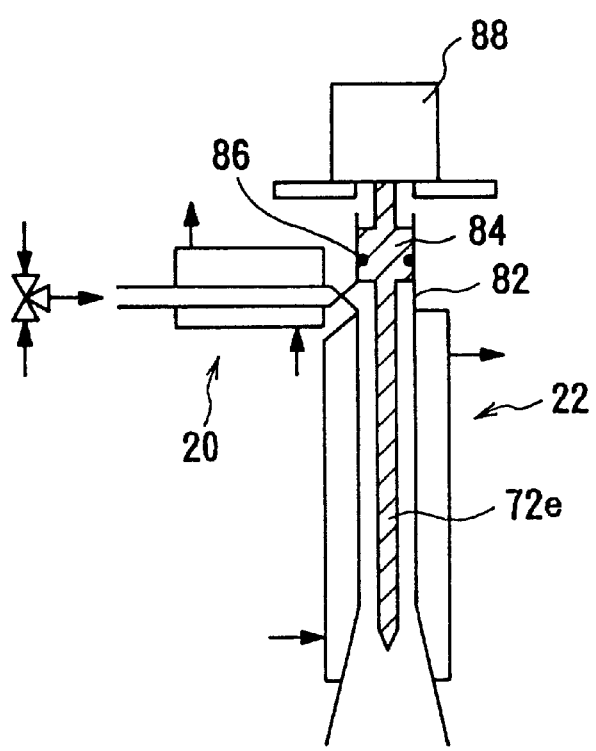
FIGS. 16A & 16B are cross sectional views of movable core type vaporizer sections.

FIG. 16A shows still another variation of the core member which is freely removable from the delivery path. In this case, the delivery paths 14 of the vaporization prevention section 20 and the vaporizer section 22 intersect at right angles, and the outer tube 82 in the vaporizer section 22 is open at the top, and a core member 72e having a large diameter section 84 is inserted into the outer tube 82. The outer periphery of the large diameter section 84 has an O-ring seal member 86 to act as a hermetic seal for the outer tube 82. At the top of the outer tube 82, there is a lifting device 88 for raising or lowering the core member 72e.

In this example, if the fine space between the outer tube 82 and the core member 72e becomes plugged or if a potential for such danger exists, the following steps may be taken to clean the space. By switching certain valves (not shown), the feed pipe 14 may be washed with a cleaning agent (such as solvent used in the feed liquid) which can be drained to a drain provided downstream side of the vaporizer section. While the cleaning agent is flowing through the path, the device 88 is operated to move the core member 72e vertically within the outer tube 82. This arrangement allows for the prevention or cleaning of plugging in the delivery path without breaking vacuum of the entire film deposition apparatus system.

Figure 16B:
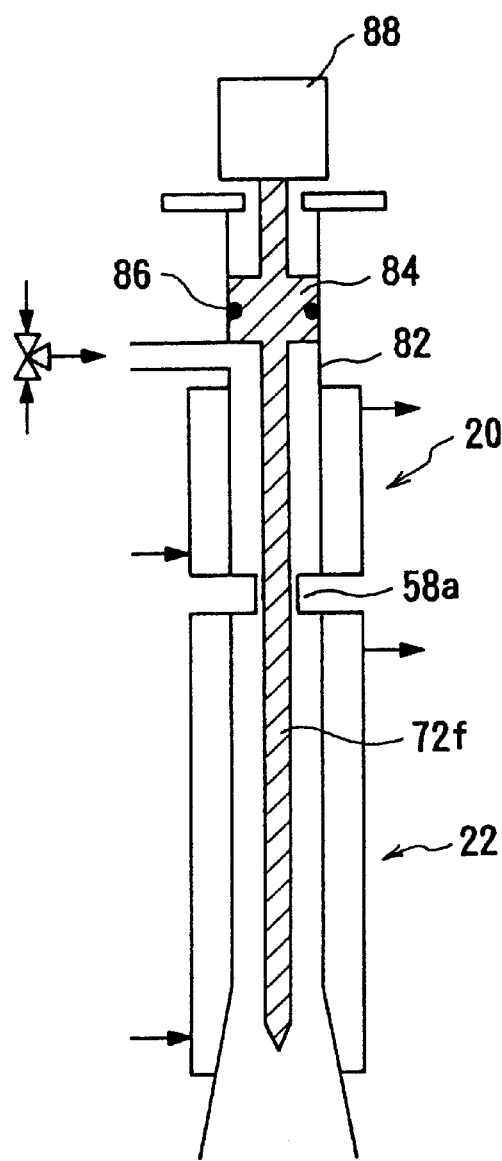

FIG. 16B shows a case of a serial connection of vaporizer section 20 with the vaporization prevention section 22. In this case, the size of the core member 72f, which corresponds to the constriction section 58a, is altered along the axis so that the core member can be raised or lowered to adjust the spacing of the constriction section 58a. In either case, the core member can be heated as in the previous case discussed above.

Figure 17A:
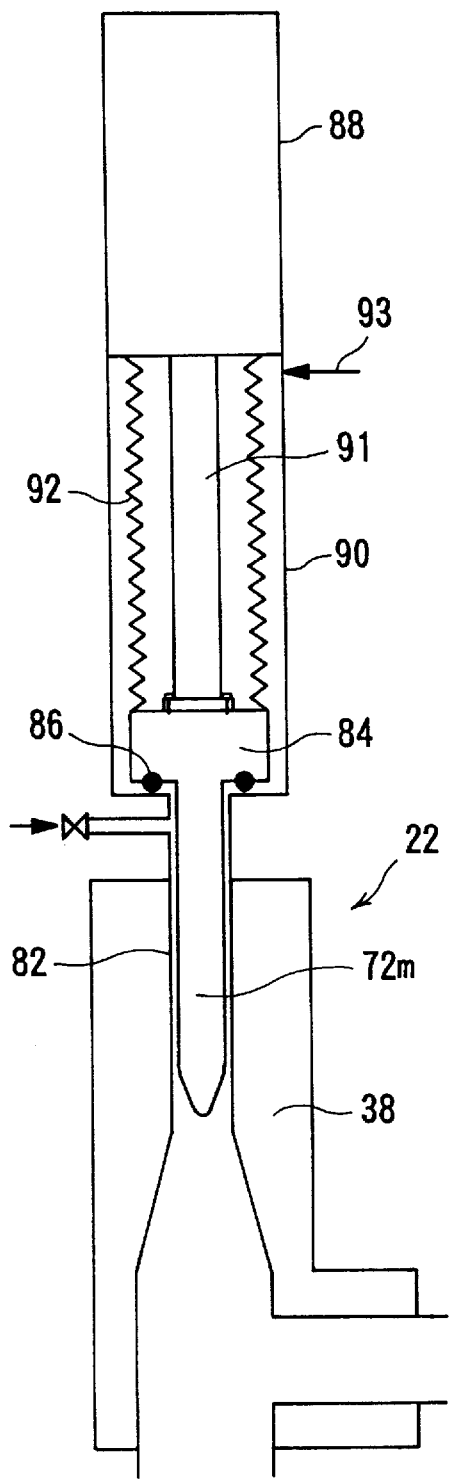
FIGS. 17A & 17B are cross sectional views of removable core type vaporizer sections.
Figure 17B:
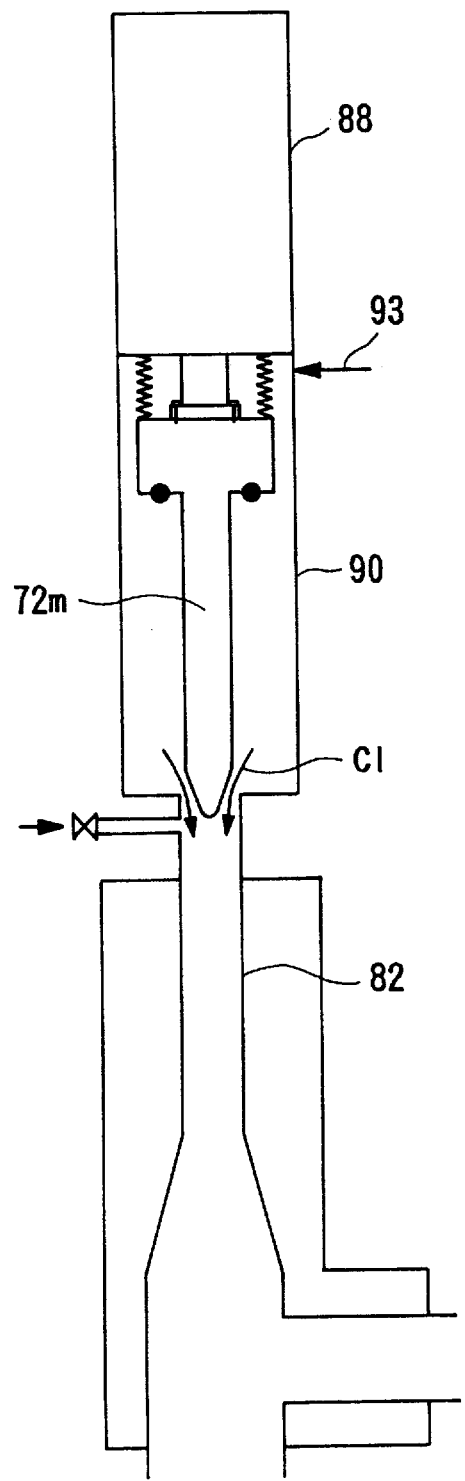

FIGS. 17A and 17B show still another variation in the core shape in which the core member 72m can be completely removed from the vaporizer section 22. This is made possible by providing a pullout region 90 which is hermetically sealed from the outside environment. A lifting device 88 is provided at the top of the pullout region 90 to raise or lower the core member 72m by means of a shaft 91. The lifting device 88 is separated from the pullout region 90 by means of a bellows section 92. The large diameter section 84 of the core member 72m is provided with an O-ring 86 to separate the pullout region 90 and the vaporizer section 22. At the top of the pullout region 90, there is a cleaning agent dispensing tube 93.

The vaporization process is performed in a state shown in FIG. 17A, where the core member 72m is lowered to insert the core member 72m into the vaporizer tube 82 so that a ring-shaped liquid path will be formed. To perform a cleaning process, the core member 72m is completely removed from the vaporizer section 22, as shown in FIG. 17B, and the cleaning agent Cl is supplied from the cleaning agent dispensing tube 93 disposed in the pullout section 90. The cleaning agent Cl cleans the core member 72m, then the inner surface of the vaporizer tube 82 and is drained from the bottom of the vaporizer section.

In this cleaning operation, because the core member 72m is pulled out of the vaporizer tube 82, both the core member 72m and the inner surface of the vaporizer tube 82 become exposed to a wide space, and therefore, a large quantity of cleaning agent Cl at a high pressure can be used for cleaning. It is clear that the present method of cleaning achieves a much higher degree of cleanliness compared with the case of cleaning the narrow ring-shaped space.

Figure 18A:
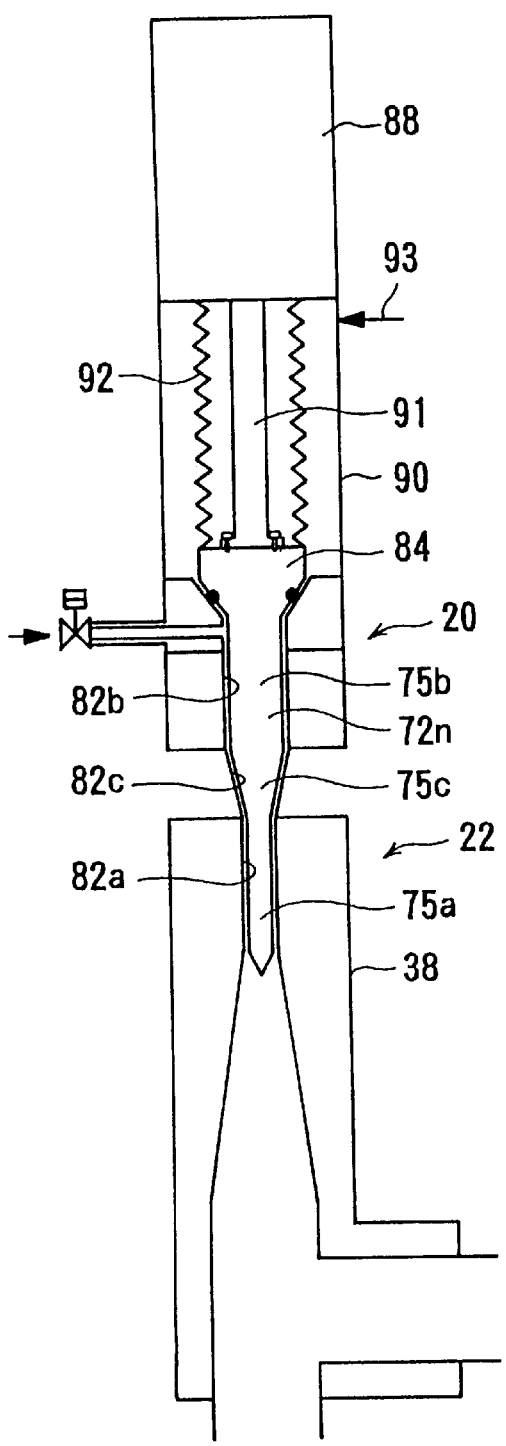
FIGS. 18A & 18B are cross sectional views of another removable core type vaporizer sections
Figure 18B:
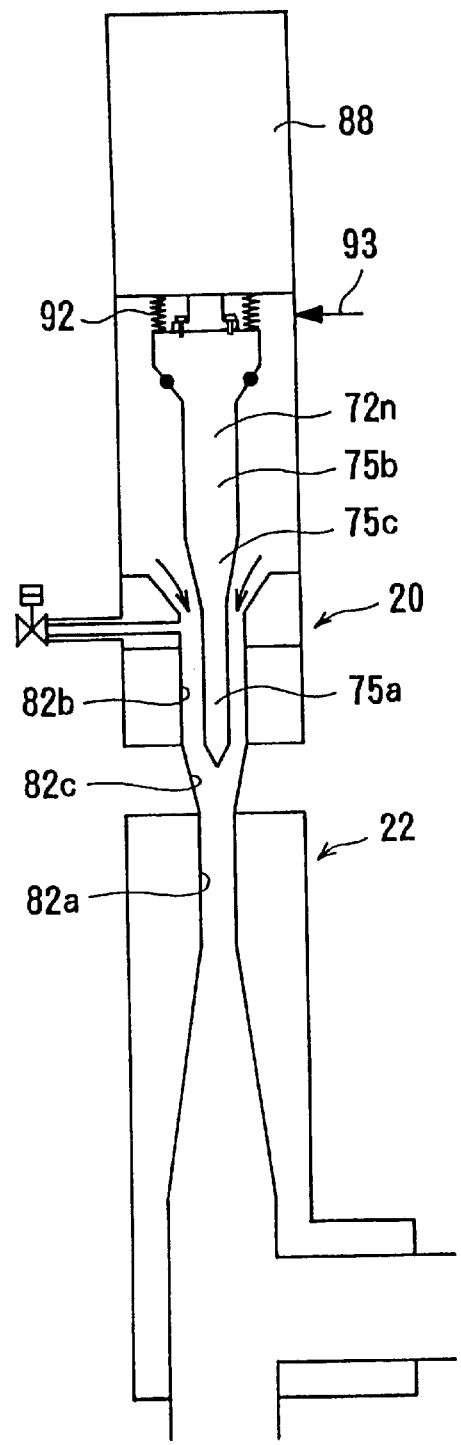

FIGS. 18A and 18B show a variation of the embodiment shown in FIGS. 17A and 17B where the core member 72m is retractably inserted in both the vaporization prevention section and the vaporizer section arranged in series. In this example, the core member 72n has different diameter sections 75a, 75b connected through tapered section 75c narrowing toward the distal end thereof. The inner passages 82a, 82b and 82c of the vaporization prevention section and the vaporizer section are configured to have a profile corresponding to that of the core member 72m. A lifting device 88 is also provided at the top of the pullout region 90 which is provided at the top of the vaporization prevention section 20.

In this embodiment, a cleaning process is also performed by retracting the core member 72n from the vaporizer section 22, as shown in FIG. 18B, and doing the same process as described above for FIG. 17B. The inner passages 82a, 82b and 82c in the vaporization prevention section are simultaneously cleaned by flowing the cleaning agent from the supplying tube 93. By providing different diameter sections to the core member 72n, it is not necessary to retract the whole core member from the vaporization prevention section 20 for forming a cleaning space having appropriate width for flowing cleaning agent. Thus, it is possible to shorten the necessary stroke for the core member 72n in such a serially arranged type of vaporizer apparatus, so that the apparatus dimension can be minimized.

Figure 19:
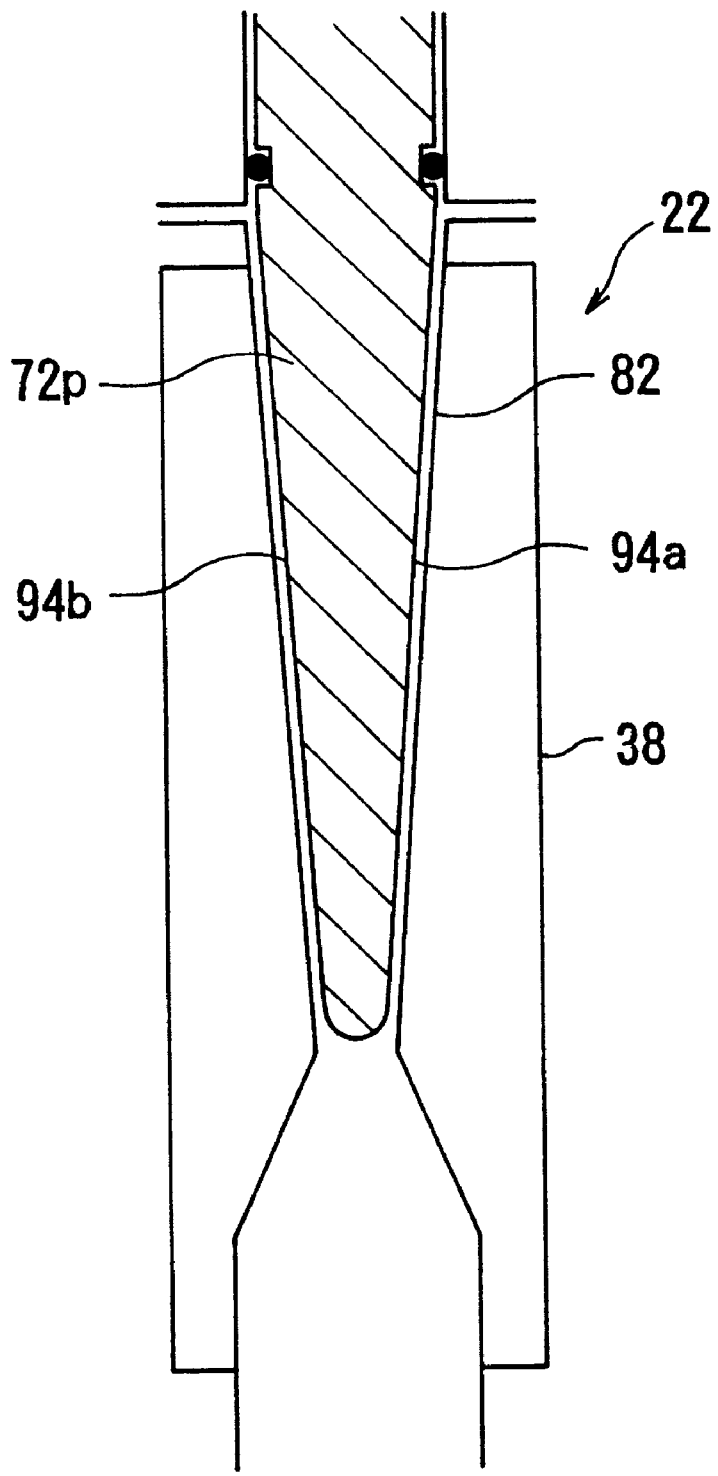
FIG. 19 is a cross sectional view of another movable core type vaporizer section.

The example shown in FIG. 19 is also similar to the one shown in FIG. 17, but includes tapered sections 94a, 94b, of equal taper angles, provided on both the core member 72p and on the vaporizer tube 82. In this example, the diameter becomes smaller in the downstream direction, but an opposite configuration will also be acceptable. With this design, it is not mandatory to remove the core member 72p completely from the vaporizer section, and partial withdrawal can achieve a cleaning space between the core member 72p and the vaporizer tube 82 for flowing a suitable quantity of cleaning agent Cl.

Figure 20:
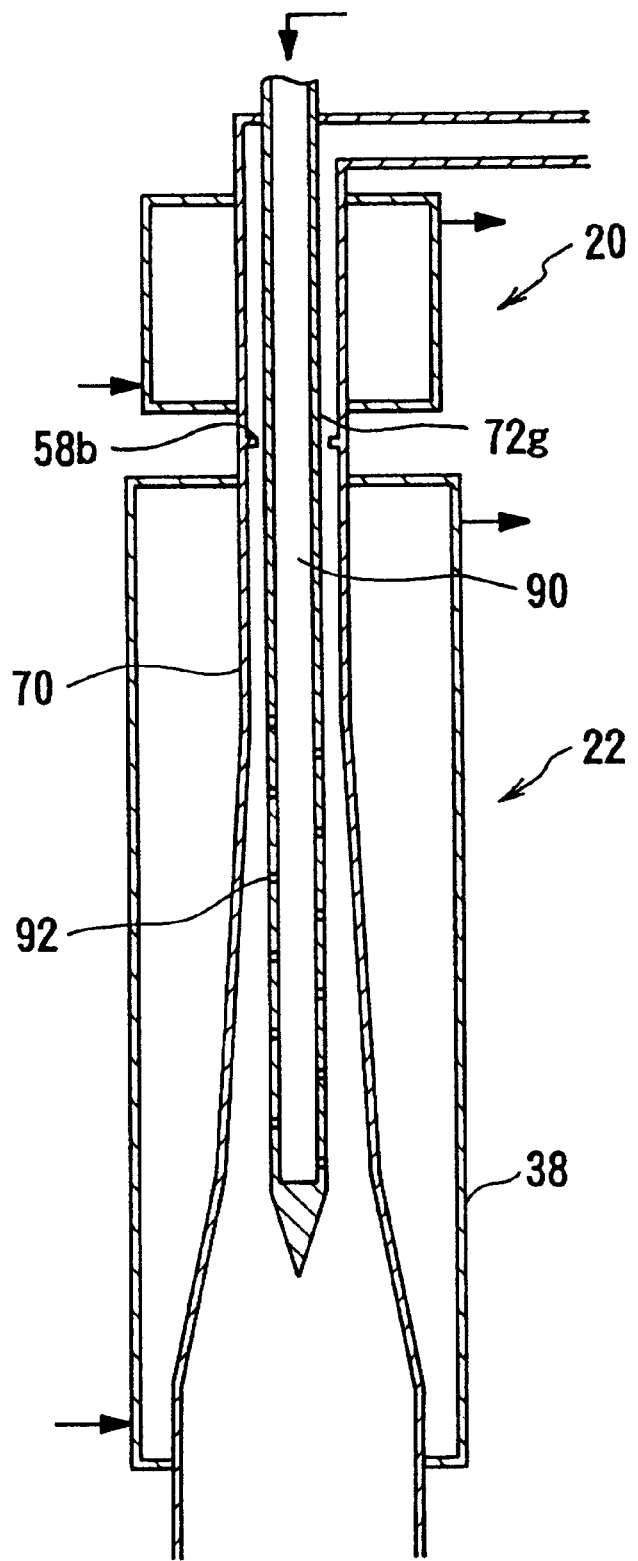
FIG. 20 is a cross sectional view of a porous type core vaporizer section.

FIG. 20 shows another example in which the core member 72g having an internal fluid path 90 and nozzle holes 92 on the outer surface. Various kinds of fluid for various purposes can be supplied through the internal liquid path 90 and the nozzle holes 92, on a periodic basis or as required, to the vaporizer section 22. The primary purposes of this design are to enhance vaporization and prevent plugging, which are achieved by supplying carrier gas, a solvent used in preparing the liquid feed or other suitable solvents or cleaning agents.

An example of using a carrier gas to enhance vaporization will be presented. In this case, the process is carried out under the condition for total vaporization of the liquid feed L as follows:

$$P_{VM}/P_T \geq Q_M/(Q_{M+QSV}+Q_{CG})$$

where $P_{VM}$ is a pressure of the liquid feed L at a temperature; $P_T$ is a total pressure of the vaporizer section; $Q_M$ is a quantity of the metallic component; $Q_{SV}$ is a quantity of solvent; and $Q_{CG}$ is a quantity of the carrier gas. $P_{VM}$ is a temperature dependent parameter, and if the temperature is constant, it is a constant. Therefore, vaporization can be enhanced if the solvent and carrier gas can be supplied through the nozzle holes 92 in the core member 72g without raising the temperature of the vaporizer section 22.

It should be noted that carrier gas, solvent, and cleaning agent can be ejected to the entry portion of the vaporizer section or to the space between the vaporization prevention (VP) section and the vaporizer section. However, if the objective is to clean the downstream stage of the vaporizer section, the cleaning agent can be ejected to the exit portion of the vaporizer to allow a large quantity of cleaning agent to be supplied.

Figure 21:
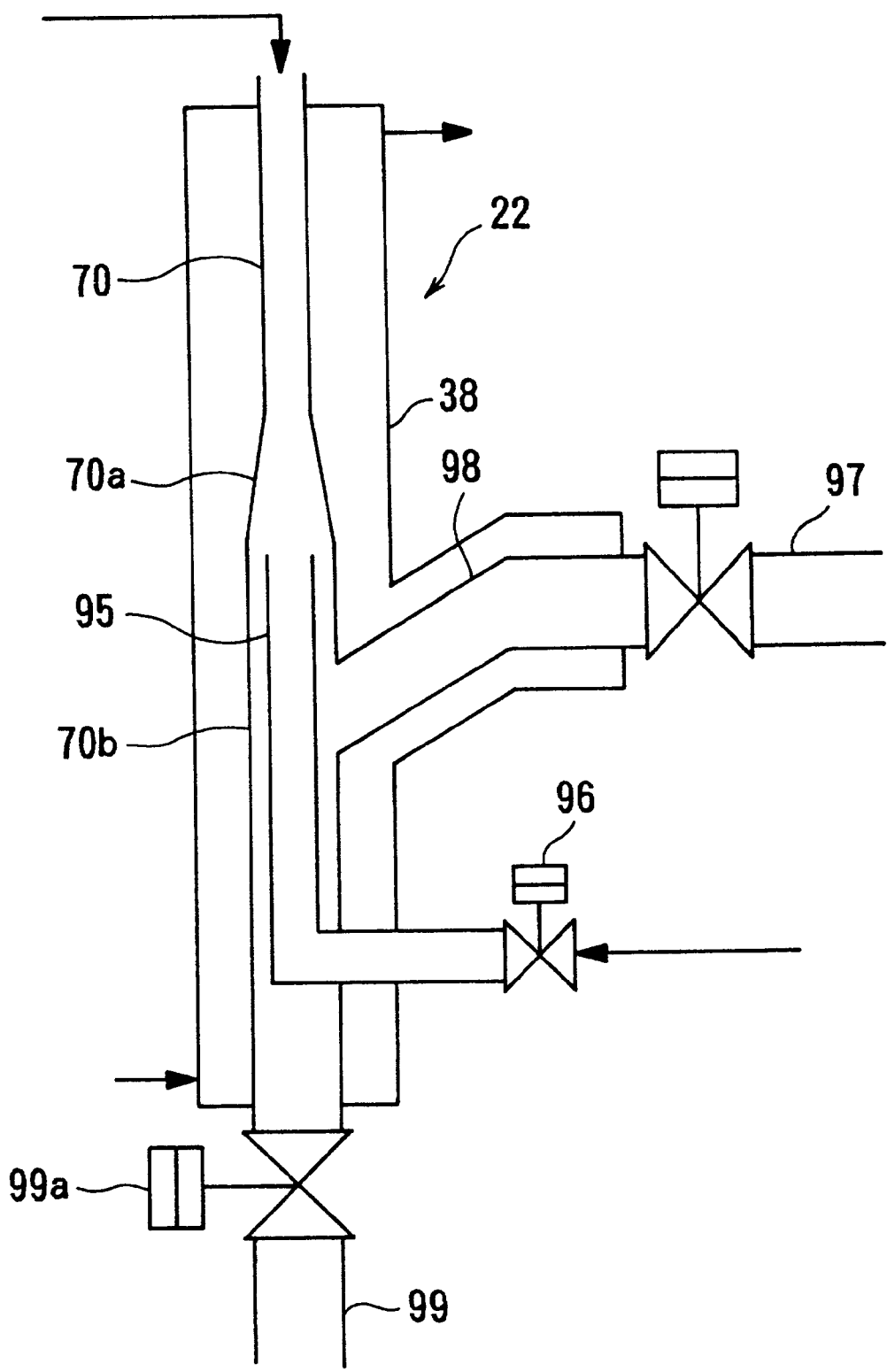
FIG. 21 is a cross sectional view of another example of a core member having substance inlet nozzles.

FIG. 21 shows an example of such a device which is arranged as a double-walled jacket heater flowing a thermal medium. A tapered expander section 70a is provided on the downstream side of the capillary tube 70 which constitutes the vaporizer section 22, and a substance entry tube 95 is provided to extend through a large diameter section 70b located at the downstream side of the expander section 70b. The entry tube 95 has an opening facing the outlet of the capillary tube 70. The substance entry tube 95 can be connected, through a shutoff valve 96, to any of the sources for carrier gas, solvent or cleaning agent. An outlet tube 97 for discharging the vaporized feed and transferring it into the film deposition chamber is connected to a large diameter section 70b further downstream of the opening of the substance entry tube 95 by way of an upward slanted section 98. A bypass pipe 99 is provided downstream of the large diameter section 70b, through a shutoff valve 99a.

In this design, during the vaporization process, a carrier gas may be supplied through the substance entry tube 95, at a flow rate appropriate to the quantity of liquid feed being introduced, from the liquid feed entry toward the vaporization region. This approach is more effective in enhancing the vaporization process compared with the approach of introducing the carrier gas through the inlet to the vaporizer section, because an unvaporized quantity of vapor in the vaporizer section 22 can be processed by directing a large quantity of carrier gas to suitable locations in the vaporization region or its downstream locations, without being hindered by the narrow ring-shape of the liquid path.

To perform cleaning during the on-going vaporization process, solvent or cleaning agents are introduced through the upward slanted section 98 and discharged from a bypass pipe 99 to carry out effective cleaning of the vaporizer section 22. It is also permissible to introduce these substances from upstream locations simultaneously. By so doing, difficult-to-reach locations such as the expander section 70a due to stagnation of the cleaning agent introduced from upstream locations can be cleaned effectively by flooding such location with the cleaning agent.

It should be noted that, because the upward slanted section 98 is provided in the outlet tube 97, unvaporized feed liquid or a re-condensed liquid (which had been vaporized earlier) is trapped in this section 98. Thus such liquids are prevented from entering into the film deposition chamber located downstream.

Figure 22:
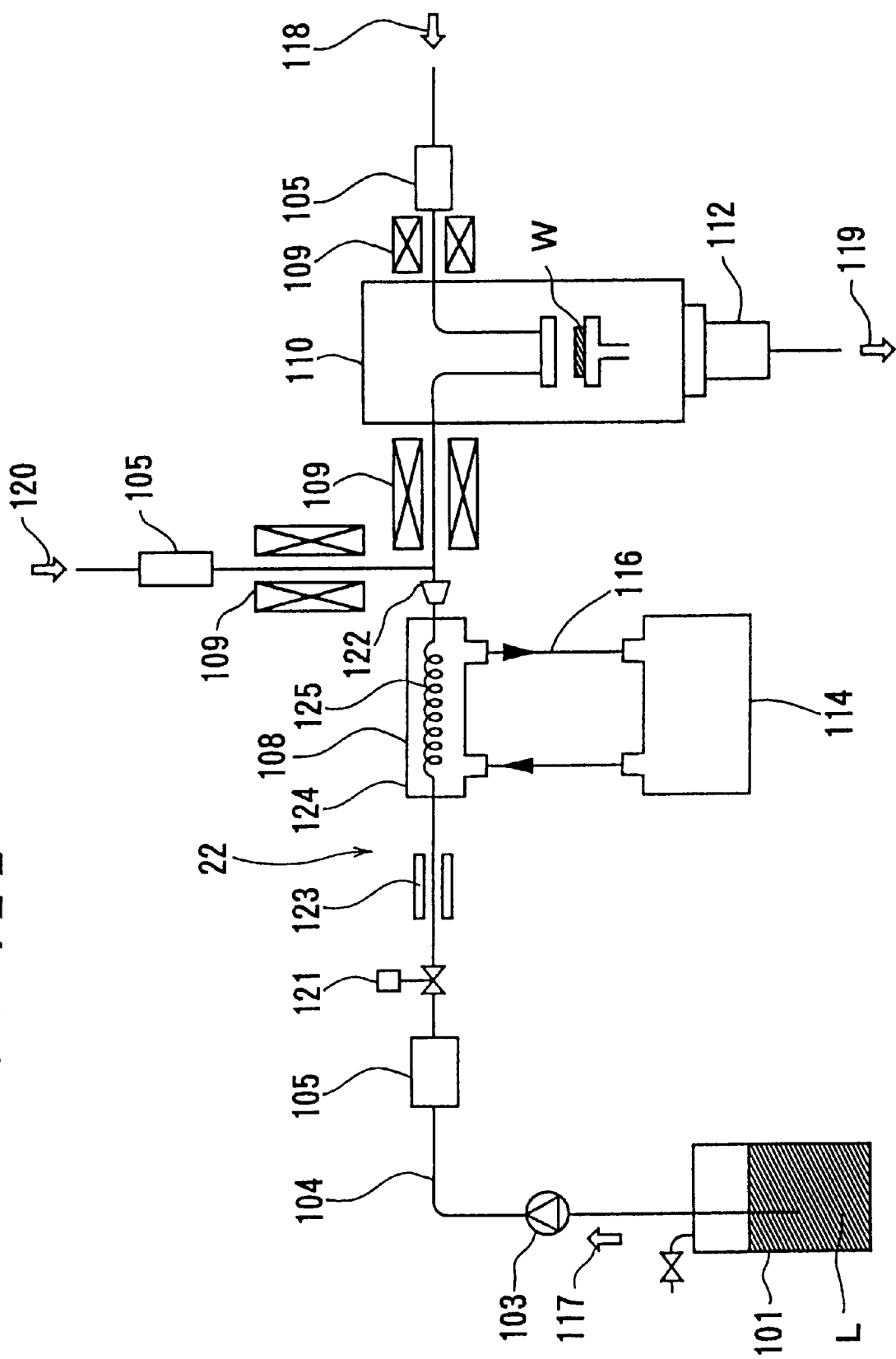
FIG. 22 is an overall schematic view of a gas ejection head of the present invention.

FIG. 22 is a schematic drawing of the overall vaporization system according to another embodiment of the present invention. This arrangement is similar to the one shown in FIG. 1, but the construction of the low- and high-temperature eat exchangers is slightly different, and a carrier gas line is an additional feature. In this system, vaporization prevention device is based on a Peltier device 123, and instead of the one-way valve, a shutoff valve 121 is used.

The vaporization device is a double-walled high-temperature heat exchanger 108 having a capillary tube 125 wound in a coil shape, and a high temperature oil 116 supplied from a constant high temperature oil tank 114 flows around the capillary tube 125. After being completely vaporized in the high-temperature heat exchanger 108, the feed vapor enters into a large diameter region of the capillary tube 125. The feed vapor passes through an expander nozzle 122, to prevent unwanted pressure fluctuations and turbulent flow. A carrier gas 120 is merged into the feed pipe 104 at the outlet of the high-temperature heat exchanger 124, to transport the feed vapor to the surface of the substrate W in the deposition chamber 110.

The surface temperature of the capillary tube 125 in the high temperature heat exchanger 108 is kept constant by circulating a high temperature oil 116 around the tube 125, so that the liquid feed L in the capillary tube 125 is heated quickly and uniformly and vaporized continuously at a constant rate. Because there is a certain amount of pressure loss due to the vaporized feed traveling in a fine tube for some distance, the feed vapor kept in the vaporization prevention section 22 disposed in the upstream side of the system maintains a constant pressure. At the same time, the liquid feed is cooled by the Peltier device 123 to a given temperature, so any pre-mature vaporization of the feed liquid or solvent is strictly prevented. For this reason, the system eliminates problems of partial vaporization or precipitation caused by differences in the boiling points of the substances comprised in the feed liquid.

Figure 23:
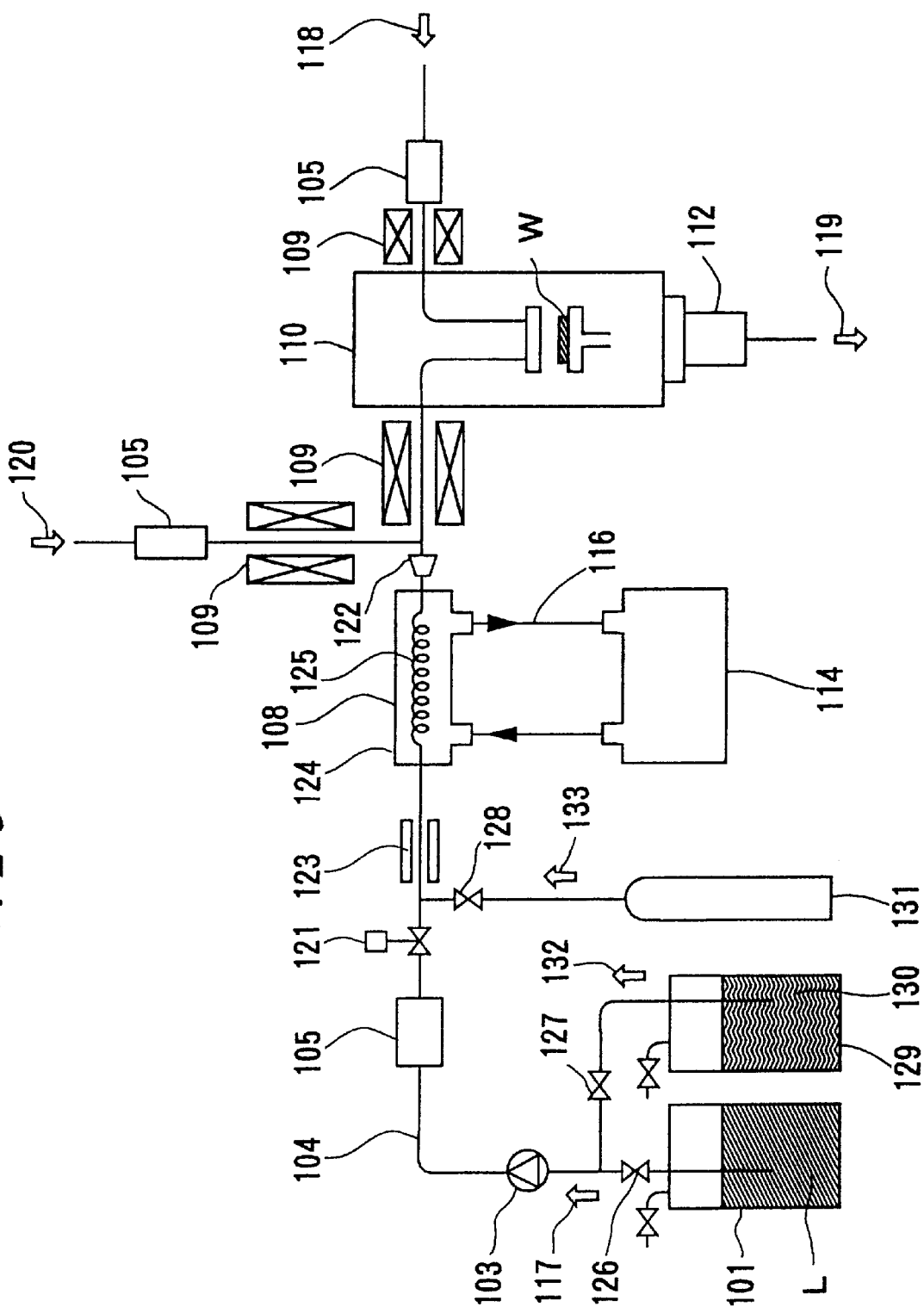
FIG. 23 is an overall schematic view of another gas ejection head of the present invention.

FIG. 23 shows still another vaporization system of the present invention. The vaporizer section is the same as that shown in FIG. 22, but this system is provided with a cleaning section. This system enables three different processes to be carried out by switching operations. The arrangement includes a cleaning agent tank 129 and a feed tank 101 connected in parallel to the delivery path 104 with the respective agent-shutoff valve 127 and feed-shutoff valve 126. A purge gas bottle 131 is also connected to the delivery path 104 with purge-shutoff valve 128 at a downstream location of the line-shutoff valve 121.

This system performs three processes: vaporizing process, purging process and cleaning process as follows. The vaporizing process is carried out by closing the purge-shutoff valve 128, and opening the feed shutoff valve 126 and the line-shutoff valve 121. The purging process is carried out by closing the line-shutoff valve 121, opening the purge-shutoff valve 128 to purge the system with a purge gas 133 so as to purge the feed line 104 in the low temperature heat exchanger (Peltier device) 123 and the high temperature heat exchanger 124. The cleaning process is carried out by closing the feed-shutoff valve 126 and the purge-shutoff valve 128, and flowing the cleaning agent 132 through the feed line 104. For the cleaning process, the temperature setting on the high temperature heat exchanger 108 may be altered from that during the vaporization process to achieve improved cleaning.

Figure 24:
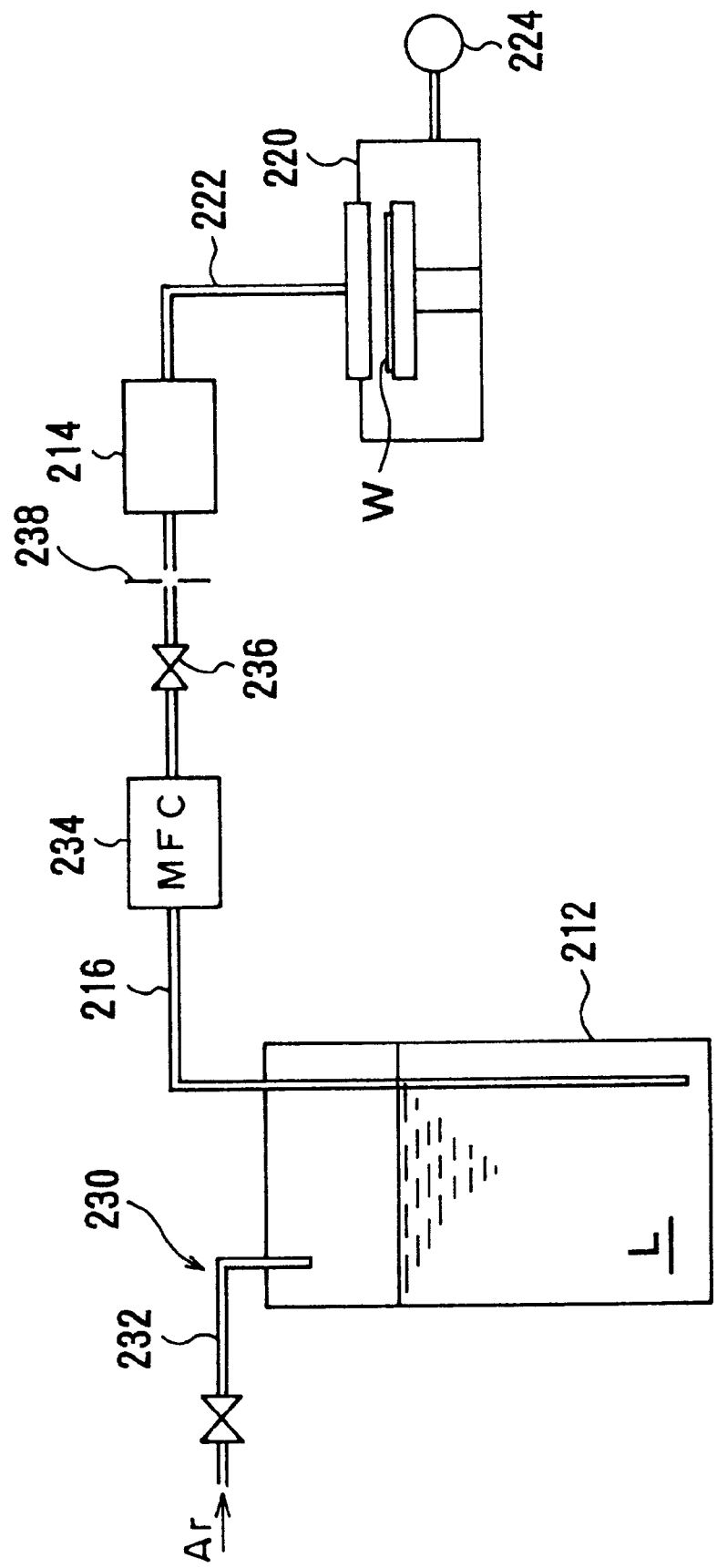
FIG. 24 is a schematic view of the chemical vapor deposition apparatus of the present invention.

FIG. 24 presents still another vaporization system. The feed tank 212 for storing the liquid feed L has an inert gas dissolution device 230 to incorporate an inert gas in the liquid feed L. Downstream of the feed tank 212, a vaporizer section 214 and a film deposition chamber 220 are connected to the system through a feed pipe 216 and a feed vapor distribution pipe 222, respectively. The vaporizer section 214 may comprise a vaporization prevention section which is described in the previous embodiments. However, it may also be of some other type comprising a porous vaporizer, for example.

The inert gas dissolution device 230 introduces an inert gas, such as $N_2$ or Ar for example, at a pressure of 6 $kgf/cm^2G$ or higher into the liquid feed L in the tank 212. The quantity of gas which can be dissolved in a liquid is proportional to the gas pressure and is inversely proportional to the temperature of the liquid. Therefore, varying the gas pressure on the liquid contained at a low temperature enables control of the quantity of dissolved gas in the liquid feed L.

The feed distribution pipe 216 has a mass flow controller (MFC) 234, and downstream of the MFC 234, a shutoff valve 236 and an orifice 238 or a one-way valve are successively placed along the flow direction of the feed. The MFC 234 is an automatic valve which permits a certain quantity of liquid, determined by the setting of the opening, to flow downstream, and the upstream side is kept at above a constant pressure by means of the orifice 238 or the one-way valve, and serves to maintain a non-separation region to prevent the dissolved inert gas from separating from the liquid feed L. If the inert gas separates out prematurely, the gas aggregates to negate the intent of the invention.

The operation of the system presented above will be explained. By introducing an inert gas into the feed tank 212 by the inert gas dissolution device 230 through the gas inlet pipe 232 at a pressure, for example, a high pressure of over 6 kgf/cm$^2$G, the inert gas such as Ar is dissolved in the liquid feed L stored in the feed tank 212. The inert gas dissolves in the liquid feed L uniformly, and the pressurized liquid feed L is forwarded to the vaporizer 214 at a rate determined by the MFC 234.

The vaporizer 214 is kept under a low pressure by means of a vacuum pump 224 connected to the deposition chamber 220, and is heated to a temperature above the vaporization temperature of the liquid feed L by means of a heater provided therein. The liquid feed L is exposed to a low pressure inside the vaporizer 214, and heated by the heater to vaporize at a given rate. As the temperature rises, the ability of the liquid feed L to retain the gas becomes lower, and the inert gas is released.

The separation of the inert gas occurs within the liquid feed L, thus promoting a turbulent flow in the liquid phase so that the feed liquid is made to contact the heated wall surfaces, as well as enhancing vaporization by reducing the partial pressure of the vaporized gas inside the vaporizer 214. The separated inert gas works as a carrier gas to transport the vaporized feed (gaseous feed) and is withdrawn into the low pressure region downstream to be quickly exhausted from the system. Further, because the separation phenomenon occurs microscopically everywhere within the liquid feed L, the specific contact area between the feed liquid and the carrier gas becomes enormous so that the effects of the carrier gas are enhanced.

The gaseous mixture of the feed and inert gases is sent to the deposition chamber 220 through the heated feed gas pipe 222, and is ejected onto the substrate W which is maintained at a predetermined reacting temperature. The vapor deposition process produces a metal-oxide thin film deposit in the gaseous feed, and the spent gas is exhausted from the deposition chamber 220 by the action of the vacuum pump 224.

The quantity of inert gas which can be dissolved in the liquid feed is limited, and if this quantity is insufficient, the inert gas may be introduced separately from the entry side to the vaporizer 214, as in the embodiment shown in FIG. 20. Alternatively if the inert gas content in the gaseous feed to be sent to the deposition chamber 222 is insufficient, inert gas may be ejected separately into the feed gas distribution pipe 222 from the exit side of the vaporizer 214 as shown in FIG. 23.

Figure 25:
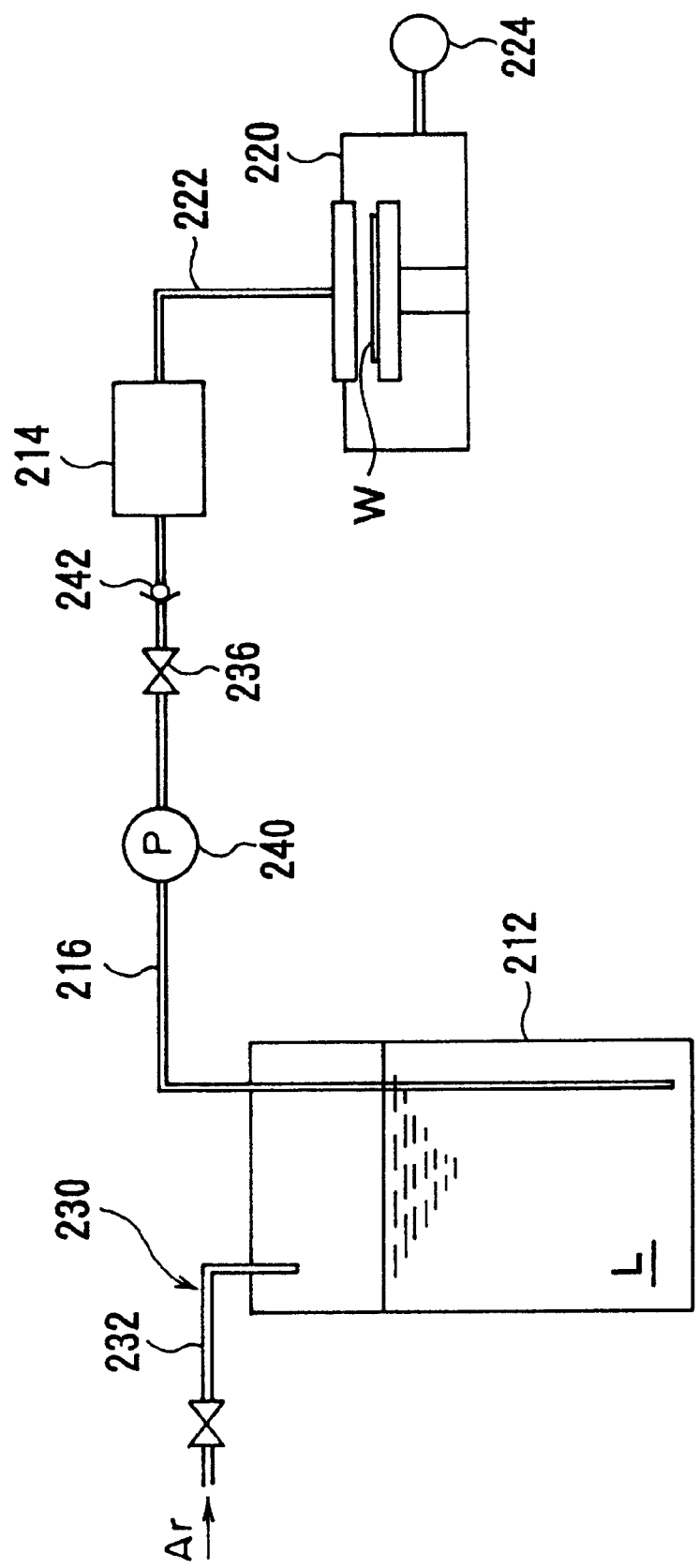
FIG. 25 is a schematic view of another chemical vapor deposition apparatus of the present invention.

FIG. 25 presents still another embodiment of the vaporization system comprising a feed tank 212 and the vaporizer 214 joined by a feed distribution pipe 216; and a feed pump 240 disposed upstream of a shutoff valve 235; and a one-way valve 242 or an orifice 238 for providing a flow resistance, disposed downstream of the shutoff valve 235. In this system also, an inert gas dissolution device 230 is provided to dissolve an inert gas such as Ar in the liquid feed at a high pressure, and the pressurized liquid feed L is sent to the vaporizer 214 by means of a pump 240. The high pressure of the liquid feed L is maintained up to the point of the one-way valve 242, and therefore, cavitation is not generated in the feed pump 240.

FIG. 26 presents still another embodiment of the vaporization system including an inert gas dissolution device 250 constituted by a porous member 254 disposed at the tip of the feed gas distribution pipe 252 which is passed through the wall of the feed tank 212. This arrangement facilitates dissolution of the inert gas in the liquid feed L.

FIG. 27 presents another embodiment of the system including a stirring device 260 for stirring the liquid feed L stored in the feed tank 212 comprising stirrer blades 262 and a motor 264 for rotating the blades 262. This arrangement is effective in forcing stirring of the liquid feed L by the blades 262 to promote dissolution of the inert gas in the liquid phase.

FIG. 28 presents another embodiment of the system including a return pipe 270 on the feed distribution pipe 216 to provide a return path to branch away from the pipe 216, at a location between the pump 240 and the shutoff valve 236, to the feed tank 212. At the tip of the return pipe 270, a liquid dispersion section 274 is provided through a shutoff valve 272, so that, by closing the shutoff valve 236 in the liquid feed delivery path 216, and opening the shutoff valve 272 in the return pipe 270 and operating the pump 240, the liquid feed L is sprayed by the liquid dispersion section 274 to enhance dissolution of the inert gas in the liquid phase.

Figure 30:
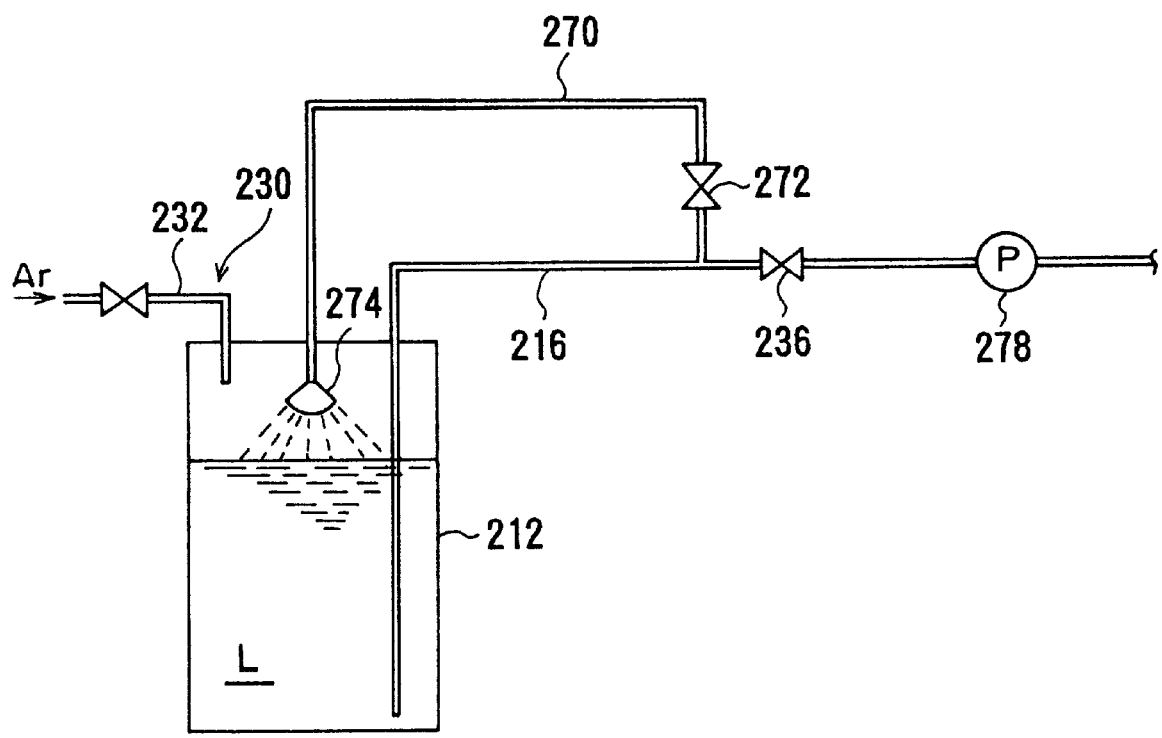
FIG. 30 is another example of the gas dissolution device.

It should be noted that of placing a MFC 276 shown in FIG. 29 or a constant flow pump 278 shown in FIG. 30 on the downstream side of the shutoff valve 236 to transport a constant quantity of liquid feed L to the vaporizer side of the system, it is possible to carry out gas dissolution processes presented above, even while the liquid feed is being transported to the vaporizer side.

Figure 31:
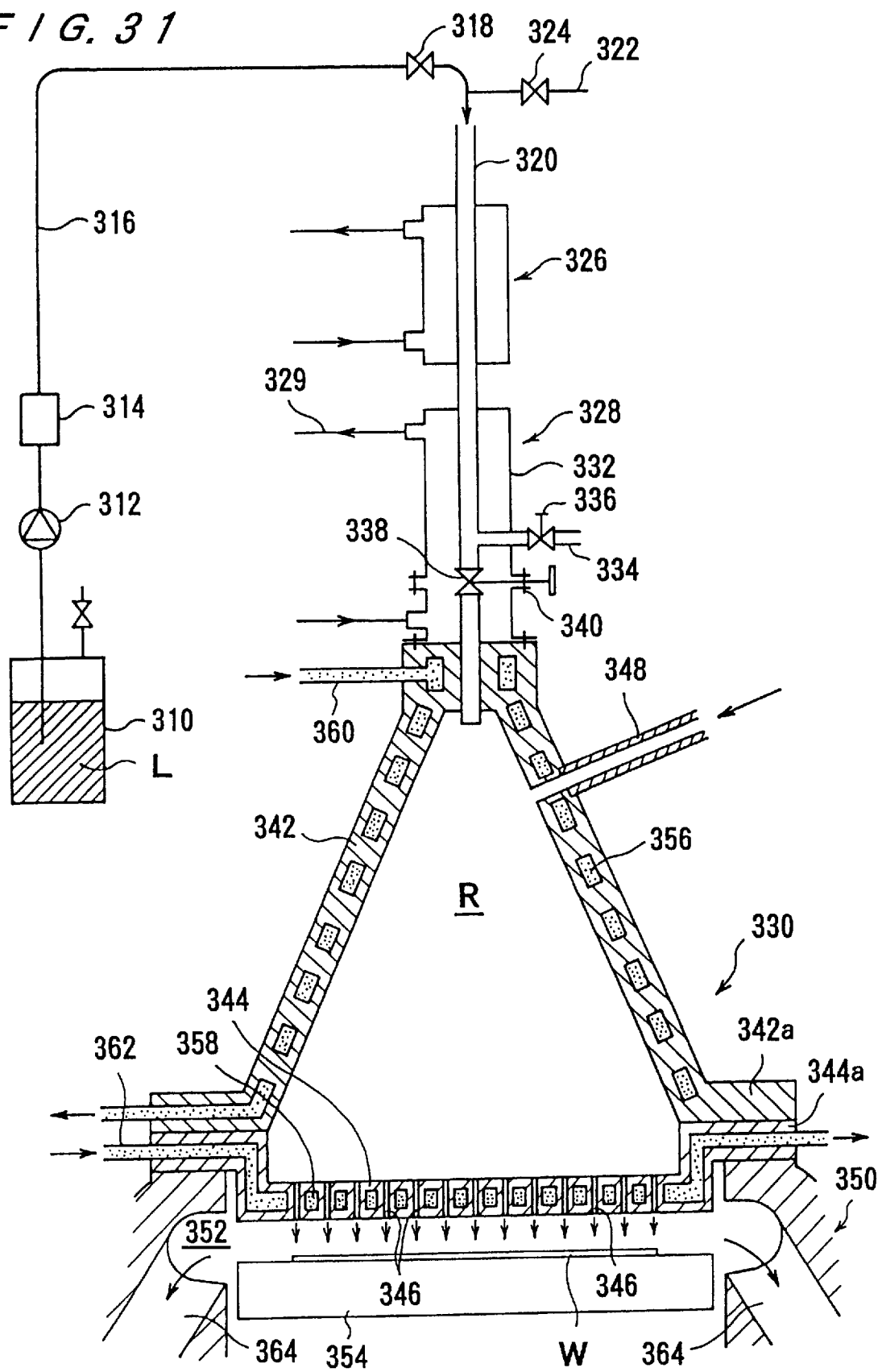
FIG. 31 is a cross sectional view of a gas ejection device of the present invention.

FIG. 31 shows an example of a gas ejection head 330 to be used with the vaporization system of the present invention. The liquid feed supply section includes a feed tank 310 and a feed delivery pipe 316 having a pump 312 and a flow controller 314. The ejection head 330 is connected through a capillary tube 320 and the shutoff valve 318 to the feed delivery pipe 316. Downstream of the shutoff valve 318, a solvent supply line 322 having a shutoff valve 324 is provided for cleaning the transport lines in the system.

The capillary tube 320 is surrounded by a low-temperature heat exchanger 326 for degradation prevention purposes, and a high-temperature heat exchanger 328 for generating vapors, and the outlet side of the high temperature heat exchanger 328 is inserted into the top section of the gas ejection head 330. It is desirable that the inner diameter of the capillary tube 320 is less than 3 mm to smoothly conduct heat transfer and vaporizing steps. The high temperature heat exchanger 328 is comprised of a double wall structure having a capillary tube 320 and a surrounding outer tube 332, and a high temperature thermal medium 329 flows in the outside space of the capillary tube 320.

The capillary tube 320 has a drain tube 334 near the outlet of the high temperature heat exchanger 328. The drain tube 334 leads to the outside of the high temperature heat exchanger 328, and is connected to a recovery facility (not shown) through a shutoff valve 336. Downstream of the branching point of the capillary tube 320, a gas shutoff valve 338 is provided and is operated by a handle protruding through a connector seal 340 provided on the outer tube 332.

The gas ejection head 330 is comprised of a cone-shaped casing 342 in the upper section, and a nozzle plate 344 covering the bottom region of the upper section, and the inside space serves as a pressure reducer section R. The pressure reducer section R moderates sudden pressure changes generated by expansion of the gaseous feed in the head 330, and is an element of the vaporizer system as well as a part of the gas ejection head 330 which functions as a mixing space for mixing the gaseous feed and the reactant gas (oxidizing gas) and directing it toward the nozzle section 346 of the nozzle plate 344.

At the top of the casing 342, there is disposed a reactant gas distribution pipe 348 for supplying a reactant gas into the head space. The outlet port of the reactant gas distribution pipe 348 can be provided in a spiral form in a tangential direction, or in a form of a plurality of equally spaced holes or a slit in the circumferential direction. The casing 342 and the nozzle plate 344 are joined through flanges 342a, 344a, and are disposed at the top of the deposition chamber so as to cover over the top of the deposition chamber 352 of the vapor deposition apparatus 350. The nozzle plate 344 is disposed with a certain distance, opposite to the substrate W placed on a pedestal 354.

Thermal medium passages 356, 358 are provided inside the overall area of the casing 342 and the nozzle plate 344 for heating the same by flowing thermal medium therein. The thermal medium passages 356, 358 communicate with medium supply device through the respective medium distribution pipes 360, 362, and are also provided with control devices to control the temperature and flow rate of the thermal medium according to signals from sensors (not shown). Insulations may be installed, as needed, on the outside of the casing 342 and the thermal medium passages 360, 362.

The operation of the gas ejection head 330 is as follows. The liquid feed L stored in the feed tank 310 is sent to the flow controller 314 through the feed pipe 316 by the action of the pump 312, into the low temperature heat exchanger 326 serving as the degradation prevention device, and into the high temperature heat exchanger 328 serving as the vaporizer to be vaporized. The gaseous feed is sent to the reducer section R, and while gradually expanding to avoid generating sudden pressure changes and turbulent flows in the head space, the gas flow pattern becomes laminar. The gaseous feed is mixed with a reactant gas and is ultimately ejected out of the nozzle holes 46 in the nozzle plate 344 toward the substrate W. The spent gas is exhausted through the exhaust port 364.

In this embodiment, the combination of capillary tube 320 and the high temperature heat exchanger 328 generates vapors efficiently from the liquid feed L, and the gaseous feed so produced is directly led to the reducer section R to produce a laminar flow which is ejected from the nozzles 346 onto the substrate W. Therefore, the gaseous feed does not have to travel through extra passages thus eliminating opportunities for the feed gas to degrade or the precipitating particles of the constituent components to plug up the system during the transport process of the vapors. Temperature changes in the system are prevented by insulating the ejection head and associated parts so that the gaseous feed of a constant desired temperature can be delivered onto the substrate W to produce devices of outstanding performance in a compact energy-saving apparatus.

The supply of reactant gas at the top of the reducer section R promotes uniform mixing of the gaseous feed due to the expansion energy of the vaporized feed. Placing the nozzle plate 344 at the bottom of the reducer section R promotes uniform distribution of gaseous feed flowing in a laminar pattern produced in the reducer space, and the gas of constant and even composition is ejected uniformly across the nozzle plate 344 into the deposition chamber 352. The low temperature heat exchanger 326 is disposed ahead of the high temperature heat exchanger 328 so that premature degradation of the feed liquid before it enters into the vaporizer section is prevented.

When the deposition process on the substrate W is completed, the supply of gaseous feed to the deposition chamber 352 is stopped by stopping the pump 312, and closing shutoff valves 318, 338. The shutoff valve 336 on the drain pipe 334 and the shutoff valve 324 on the solvent pipe 322 are opened to discharge the solvent such as THF, and the capillary tube 320 is cleaned to discharge any residual material in the capillary tube 320 to the recovery facility.

Figure 32:
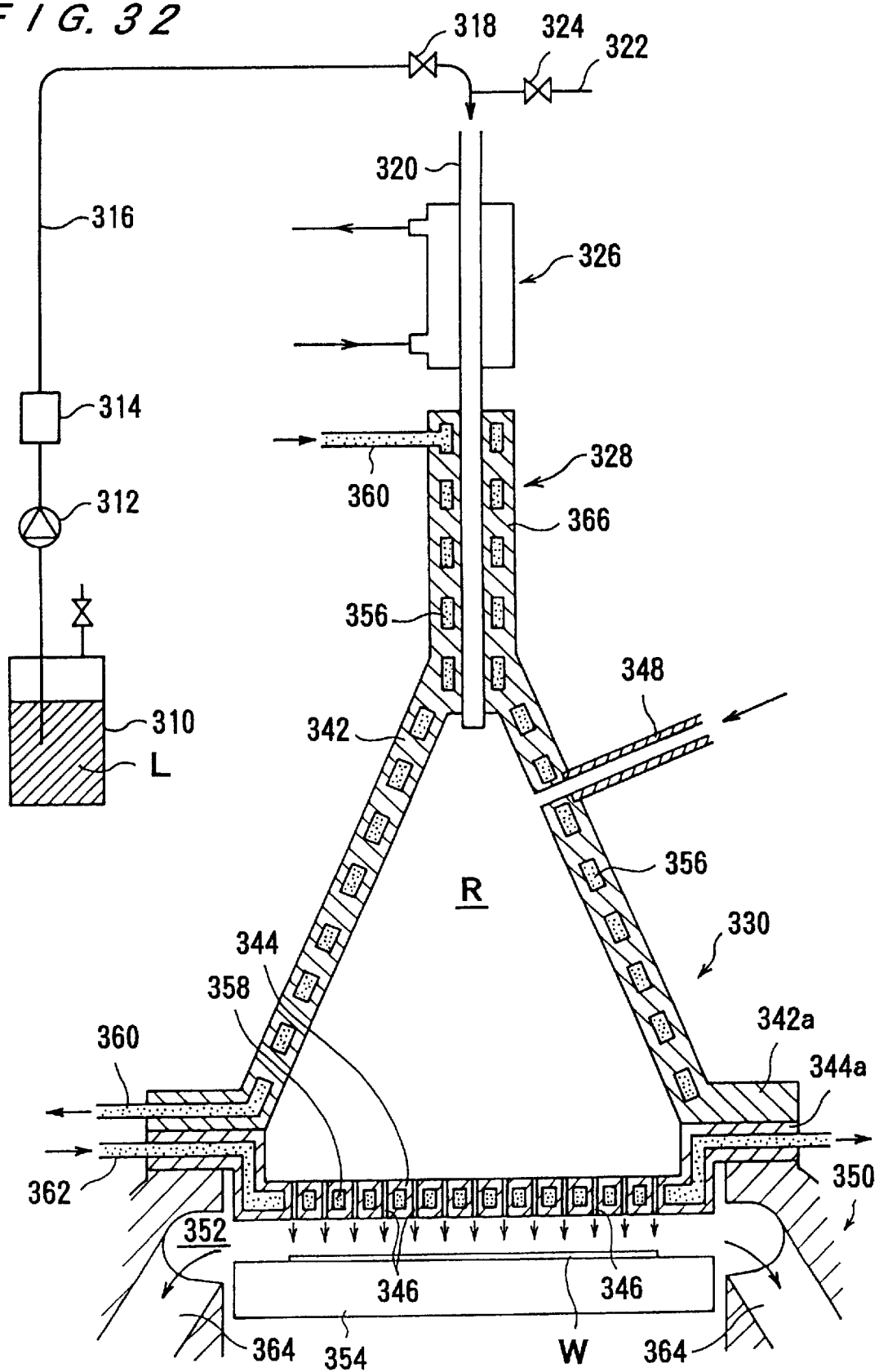
FIG. 32 is a cross sectional view of another gas ejection device of the present invention.

FIG. 32 presents an embodiment of the system incorporating another gas ejection head. In this case, the high temperature heat exchanger 328 and the casing 342 are made into a single unit. In more detail, the top of the casing 342 includes a cylindrical wall 366 which houses the thermal medium passages 356. When the high temperature heat exchanger 328 and the reducer section R can be kept at a common temperature, this arrangement is more advantageous.

However, even in such an integrated construction of the high temperature heat exchanger 328 and the casing 342, it is not necessarily required to share a common medium passage 356. It is obvious that separate passages can be provided with separate temperature control devices. Also, shutoff valves are not provided in this example, however, to stop the flow of the gaseous feed. It is only necessary to shut off the liquid feed supply, and for cleaning purpose, the cleaning gas can be used which can be discharged through the deposition chamber 352.

Figure 33:
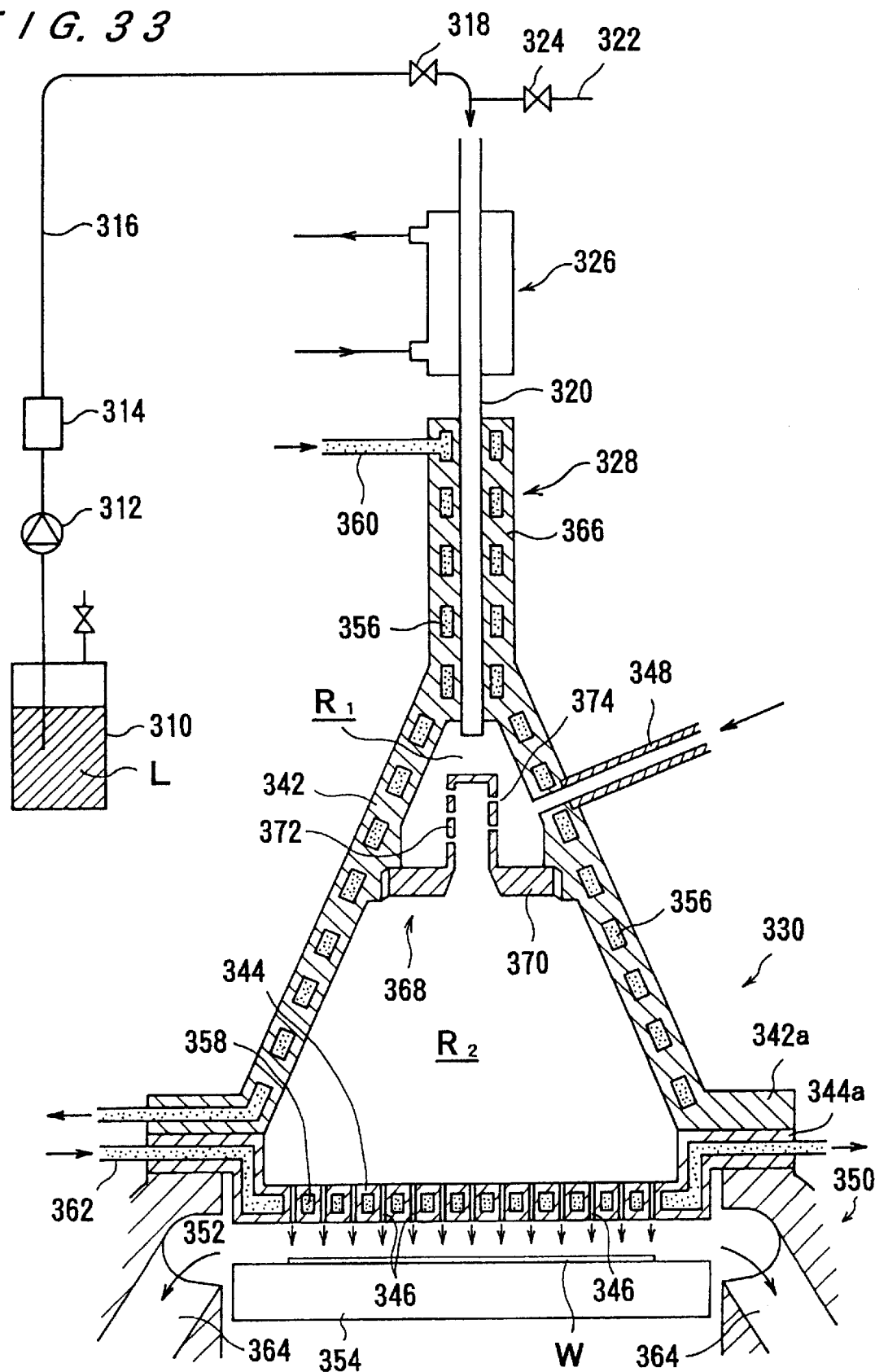
FIG. 33 is a cross sectional view of another example of the gas ejection device of the present invention.

FIG. 33 presents a variation of the embodiment shown in FIG. 32, which includes a flow control plate 368 separating the reducer section R into top and bottom sections. By this arrangement, the interior space is divided into a first mixing space $R_1$ and a second mixing space $R_2$, and the outlet of the reactant gas pipe 348 is provided in the first mixing space $R_1$. The flow control plate 368 comprises a circular disc member 370 having a center hole and a closed-top cylindrical section 372 covering the hole and protruding upward. The lateral surface of the cylindrical section 372 has a plurality of flow holes 374 of a sufficiently small diameter for mixing the reactant gas with the gaseous feed.

In this arrangement, the feed gas mixed uniformly in the first mixing space $R_1$ by the action of the expansion energy of the gaseous feed is mixed further in the process of being transported through the flow holes 374 into the second mixing space $R_2$. In the second mixing space $R_2$, the mixed feed gas of uniform composition is transported in a laminar manner to each of the nozzles 346 to be ejected into the deposition chamber 352 evenly and at a controlled rate so that the substrate W can produce a device of outstandingly uniform performance characteristics.

What is claimed is:

1. A vaporization apparatus for converting a liquid feed to a vapor feed, comprising:
   a liquid feed delivery path for conveying a liquid feed;
   a vaporization prevention component at said liquid feed delivery path for preventing vaporization of the liquid feed conveyed through said liquid feed delivery path;
   a vaporization path downstream of said liquid feed delivery path, said vaporization path having a heat receiving area of at least 2 mm$^2$ per 1 mm$^3$ volume of the liquid feed within said vaporization path and including an annular portion having an annular cross-section; and a heating component at said vaporization path for heating said vaporization path.

2. The vaporization apparatus of claim 1, wherein said vaporization path includes a vaporization promotion region comprising a narrow flow passage, and includes a pressure buffer region comprising a wide flow passage, said vaporization promotion region being adjacent to said pressure buffer region.

3. The vaporization apparatus of claim 1, wherein said heating component is arranged at said vaporization path so as to provide heat to said vaporization path from a position at an interior of said vaporization path and from a position at an exterior of said vaporization path.

4. The vaporization apparatus of claim 1, wherein said annular portion having an annular cross-section includes an outer tube and a core member disposed in said outer tube.

5. The vaporization apparatus of claim 4, wherein said core member has an internal heating device.

6. The vaporization apparatus of claim 1, wherein said heating component comprises a jacket member surrounding said vaporization path for receiving a thermal fluid medium therein.

7. The vaporization apparatus of claim 6, wherein said jacket member includes a thermal medium passage for supplying the thermal fluid medium.

8. The vaporization apparatus of claim 6, wherein said heating component includes a heater member disposed in a vicinity of said vaporization path.

9. The vaporization apparatus of claim 1, wherein said vaporization prevention component is constructed so as to prevent heat generated in said vaporization path from affecting the liquid feed in said vaporization prevention component.

10. The vaporization apparatus of claim 9, wherein said vaporization prevention component includes insulation material arranged to form a barrier so as to prevent heat flow from said vaporization path into said vaporization prevention component.

11. The vaporization apparatus of claim 10, wherein said vaporization prevention component further includes a low-temperature heat exchanger for maintaining liquid feed in said vaporization prevention component at a constant temperature.

12. The vaporization apparatus of claim 1, wherein said annular portion includes a core member having an internal heating device and a temperature sensor.

13. The vaporization apparatus of claim 1, further comprising a vapor deposition chamber downstream of said vaporization path, said vapor deposition chamber including a vapor feed ejection device.

* * * * *